(12) United States Patent
Fukai et al.

(10) Patent No.: US 7,439,124 B2
(45) Date of Patent: Oct. 21, 2008

(54) METHOD OF MANUFACTURING A SEMICONDUCTOR DEVICE AND SEMICONDUCTOR DEVICE

(75) Inventors: Toshinori Fukai, Kanagawa (JP); Akihito Sakakidani, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 102 days.

(21) Appl. No.: 11/401,290

(22) Filed: Apr. 11, 2006

(65) Prior Publication Data
US 2006/0226558 A1   Oct. 12, 2006

(30) Foreign Application Priority Data
Apr. 11, 2005   (JP)   ............................. 2005-113982

(51) Int. Cl.
*H01L 21/8238* (2006.01)
(52) U.S. Cl. .................. 438/231; 257/371; 257/344; 257/E21.626; 257/E21.632; 257/900
(58) Field of Classification Search .............. 438/231; 257/E21.626
See application file for complete search history.

(56) References Cited

U.S. PATENT DOCUMENTS 5,439,834 A * 8/1995 Chen ........................... 438/228

2006/0170117 A1 * 8/2006 Tamura et al. ............... 257/900

FOREIGN PATENT DOCUMENTS

JP   2004-349372   12/2004

* cited by examiner

*Primary Examiner*—Tu-Tu V Ho
(74) *Attorney, Agent, or Firm*—Young & Thompson

(57) ABSTRACT

Method of manufacturing a semiconductor device includes: forming a substrate protection film to cover an n-type FET forming region having a first gate electrode and a p-type FET forming region having a second gate electrode; opening the p-type FET forming region by patterning a resist film after the resist film is formed to cover the n-type FET and p-type FET forming regions; exposing the surface of the semiconductor substrate by selectively removing the substrate protection film in the p-type FET forming region, leaving the film only on side walls of the second gate electrode; forming a pair of p-type extension regions at both sides of the second gate electrode, by doping impurities to the semiconductor substrate, with the resist film, the second gate electrode, and the substrate protection film formed on side walls of the second electrode; and removing the resist film formed on the n-type FET forming region.

7 Claims, 23 Drawing Sheets

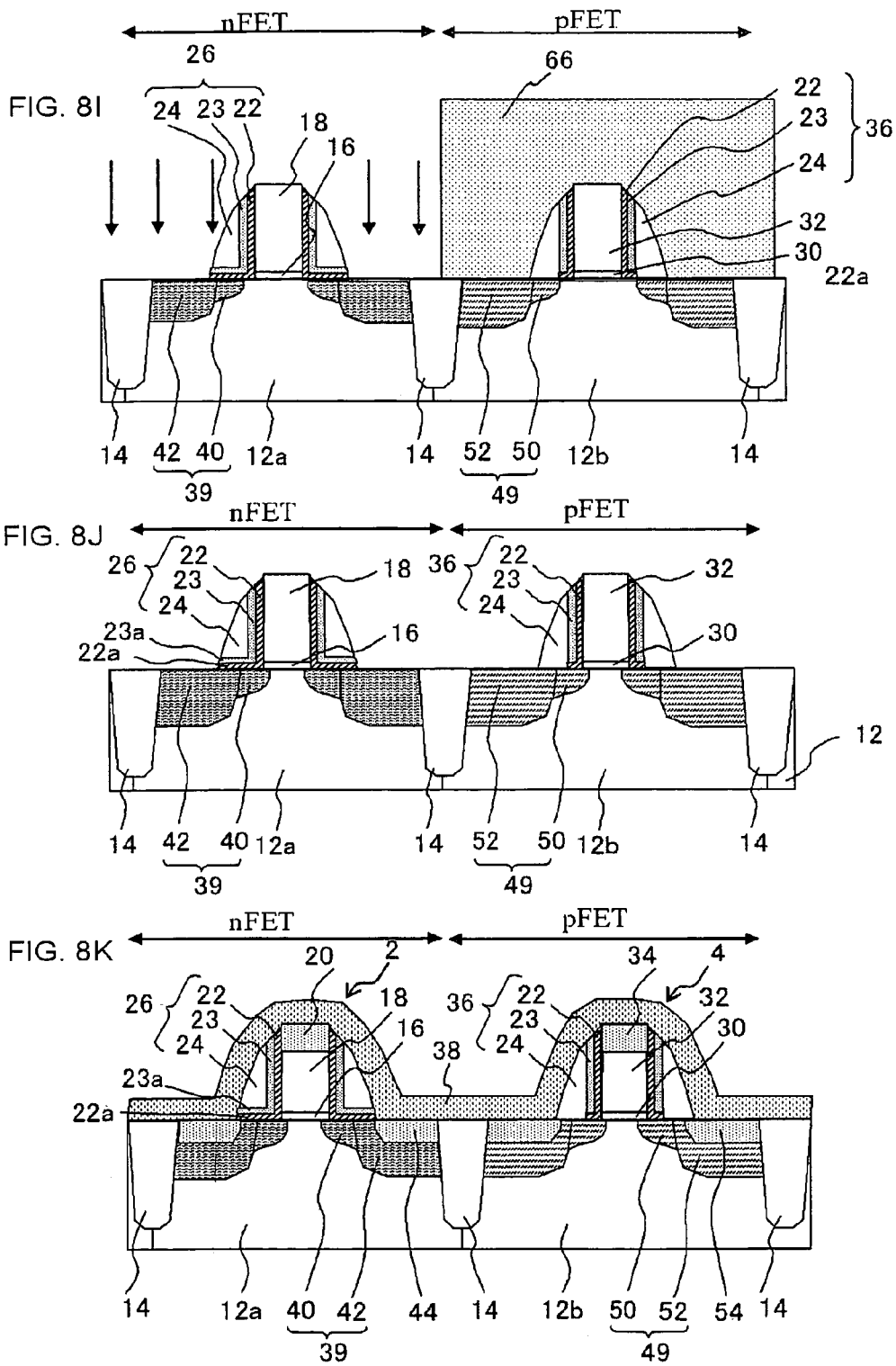

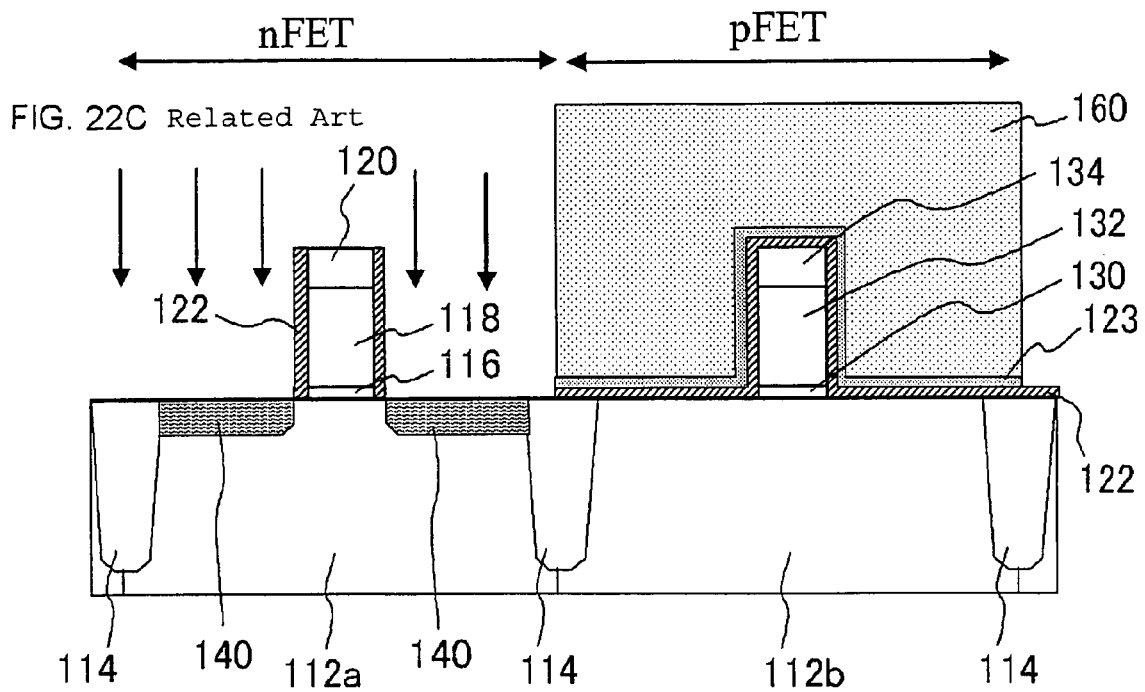
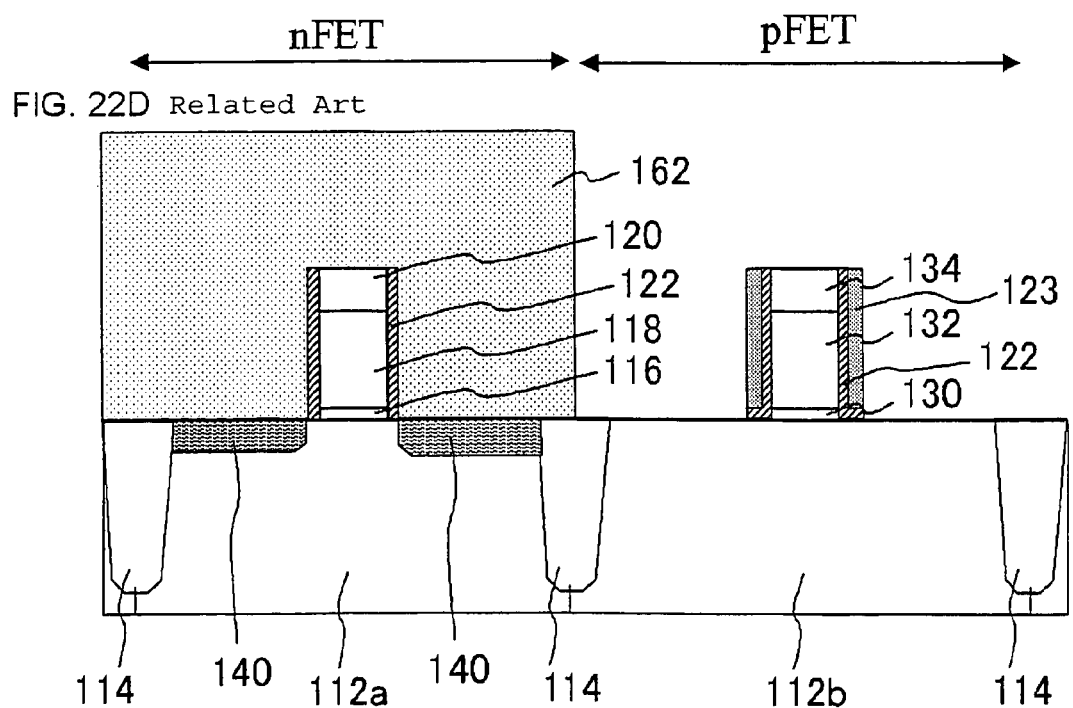

METHOD OF MANUFACTURING A SEMICONDUCTOR DEVICE AND SEMICONDUCTOR DEVICE

This application is based on Japanese Patent application NO. 2005-113982, the content of which is incorporated hereinto by reference.

BACKGROUND

1. Technical Field

The present invention relates to a method of manufacturing a semiconductor device having an n-type FET and a p-type FET. The present invention also relates to such a semiconductor device.

2. Related Art

A conventional semiconductor device that has an n-type FET and a p-type FET is disclosed in Japanese Laid-open patent publication No. 2004-349372. The semiconductor device disclosed in the document is shown in FIG. 20. This semiconductor device 100 includes an n-type FET forming region having an n-type FET 102 formed on a semiconductor substrate 112, and a p-type FET forming region having a p-type FET 104 formed on the semiconductor substrate 112. In the drawings, "nFET" indicates the "n-type FET forming region" in which the n-type FET is to be formed or has already been formed. Also, "pFET" indicates the "p-type FET forming region" in which the p-type FET is to be formed or has already been formed. The n-type FET forming region and the p-type FET forming region are separated from each other by a device isolation layer 114 formed by STI (Shallow Trench Isolation) in the semiconductor substrate 112.

In the n-type FET forming region, a p-type well 112a is formed in the semiconductor substrate 112. Further, n$^-$-type first source/drain extension regions (hereinafter referred to as the first extension regions) 140 and n$^+$-type first source/drain regions 142 are formed in surface regions of the p-type well 112a. A first gate oxide film 116 and a first gate electrode 118 are stacked on the surface of the semiconductor substrate 112. A first silicide layer 120 is formed on the top layer of the first gate electrode 118. First insulating films 122 are formed on the sidewalls of the first gate oxide film 116 and the first gate electrode 118. Sidewall insulating films 124 are formed on the outer surfaces of the first insulating films 122. The first insulating films 122 and the sidewall insulating films 124 constitute first sidewalls 126.

In the p-type FET forming region, an n-type well 112b is formed in the semiconductor substrate 112. Further, p$^-$-type second source/drain extension regions (hereinafter referred to as the second extension regions) 150 and p$^+$-type second source/drain regions 152 are formed in surface regions of the n-type well 112b. A second gate oxide film 130 and a second gate electrode 132 are stacked on the surface of the semiconductor substrate 112. A second silicide layer 134 is formed on the top layer of the second gate electrode 132. First insulating films 122 and second insulating films 123 are stacked in this order on the side walls of the second gate oxide film 130 and the second gate electrode 132. Sidewall insulating films 124 are formed on the outer surfaces of the second insulating films 123. The first insulating films 122, the second insulating films 123, and the sidewall insulating films 124 constitute second sidewalls 136. Further, a stopper layer 138 is formed so as to cover all those regions.

A method of manufacturing the semiconductor device 100 is now described with reference to the accompanying drawings. FIGS. 21A through 23G are process cross-sectional views illustrating the method of manufacturing the semiconductor device 100.

First, the semiconductor substrate 112 that has the p-type well 112a and the n-type well 112b separated by the device isolation layer 114 is prepared. In the n-type FET forming region, the first gate oxide film 116 and the first gate electrode 118 are stacked in this order on the semiconductor substrate 112. In the p-type FET forming region, the second gate oxide film 130 and the second gate electrode 132 are stacked in this order on the semiconductor substrate 112. The first silicide layer 120 is formed on the top layer of the first gate electrode 118, and the second silicide layer 134 is formed on the top layer of the second gate electrode 132. The first insulating film 122 and the second insulating film 123 are stacked in this order so as to cover the n-type FET forming region and the p-type FET forming region (FIG. 21A).

Next, the p-type FET forming region is covered with a resist film 160. The resist film 160 is patterned so as to open the n-type FET forming region. Predetermined etching is then performed in the n-type FET forming region. Through the etching, the first insulating film 122 and the second insulating film 123 are removed from the first silicide layer 120 and from the surface of the semiconductor substrate 112. The second insulating film 123 is further removed from the side walls of the first gate electrode 118, so that only the first insulating film 122 is left on the side walls of the first gate electrode 118 (FIG. 21B).

Ion implantation is then performed through the exposed surface of the semiconductor substrate 112, so as to form the first extension regions 140 that serve as electric connecting portions between the channel regions and the first source/drain regions 142 described later in surface layer of P type well 112a (FIG. 22C).

Next, the n-type FET forming region is covered with a resist film 162. The resist film 162 is patterned so as to open the p-type FET forming region. In the p-type FET forming region, the first insulating film 122 and the second insulating film 123 are removed formed on the surface of the semiconductor substrate 112 by etching or the like, so that the surface of the semiconductor substrate 112 is exposed (FIG. 22D)

Ion implantation is then performed through the exposed surface of the semiconductor substrate 112, so as to form the second extension regions 150 that serve as electric connecting portions between the channel regions and the second source/drain regions 152 described later in surface layer of N type well 112b (FIG. 23E).

After the resist film 162 is removed, an insulating film (not shown) is formed so as to cover those regions, and etchback is performed. The first sidewalls 126 are then formed on the side walls of the first gate oxide film 116 and the first gate electrode 118, and the second sidewalls 136 are formed on the side walls of the second gate oxide film 130 and the second gate electrode 132 (FIG. 23F). The stopper layer 138 is then formed so as to cover the n-type FET forming region and the p-type FET forming region. Thus, the semiconductor device 100 having the n-type FET 102 and the p-type FET 104 is completed (FIG. 23G).

In the semiconductor device disclosed in the above-described document, however, there is room for improvement. In the n-type FET 102, the first insulating films 122 are formed only on the side walls of the first gate electrode 118, and the surface of the semiconductor substrate 112 is exposed. Because of this, the surface regions of the substrate in which the first extension regions 140 are formed deteriorate during the procedures for removing the resist film and forming the sidewalls. As a result, the characteristics of the n-type FET are degraded.

On the other hand, the method of manufacturing the semiconductor device disclosed in the above-described document also has room for improvement. In the n-type FET forming region in the semiconductor substrate 112, the surface regions of the substrate in which the first extension regions 140 are formed are not protected, when the resist film 160 is removed in the p-type FET forming region (FIGS. 22C and 22D). In the n-type FET forming region in the semiconductor substrate 112, the resist film 162 formed directly on the substrate surfaces in which the first extension regions 140 are formed is removed (FIGS. 23E and 23F). During the procedures for removing the resist films, the substrate surface layers in which the first extension regions 140 are formed tend to deteriorate, resulting in degradation of the characteristics of the n-type FET 102.

The degradation of the characteristics of an n-type FET causes a variation in performance of a semiconductor device. As the diffusion in the first extension regions has been becoming shallower these days, the condition of the surface of the semiconductor substrate greatly affects the characteristics of the n-type FET. Therefore, when the surface of the semiconductor substrate deteriorates, the characteristics of the n-type FET are even more degraded. With this situation being taken into consideration, degradation of the characteristics of the n-type FET should be restrained, so that a short-channel effect in the n-type FET forming region can be restrained and the characteristics of the n-type FET can be improved.

SUMMARY OF THE INVENTION

According to the present invention, there is provided a method of manufacturing a semiconductor device that includes: forming a substrate protection film so as to cover an n-type FET forming region having a first gate electrode formed on a semiconductor substrate and a p-type FET forming region having a second gate electrode formed on the semiconductor substrate; opening the p-type FET forming region by patterning a resist film after the resist film is formed so as to cover the n-type FET forming region and the p-type FET forming region; exposing the surface of the semiconductor substrate by selectively removing the substrate protection film in the p-type FET forming region, so as to leave the substrate protection film only on side walls of the second gate electrode; forming a pair of p-type extension regions located in the vicinity of the surface of the semiconductor substrate at both sides of the second gate electrode and by doping impurities to the semiconductor substrate, with the resist film, the second gate electrode, and the substrate protection film formed on the side walls of the second electrode serving as masks; and removing the resist film formed on the n-type FET forming region.

In accordance with the present invention, degradation of the characteristics of the n-type FET in the n-type diffusion layer formed on the semiconductor substrate can be restrained during the semiconductor manufacturing process. Accordingly, a short-channel effect can be restricted, and the characteristics of the n-type FET can be improved.

According to the present invention, there is provided a semiconductor device that includes: an n-type FET that has a first gate electrode formed on a semiconductor substrate, a pair of n-type diffusion layers located in the vicinity of the surface of the semiconductor substrate at both sides of the first gate electrode, and a first sidewall formed at both sides of the first gate electrode; and a p-type FET that has a second gate electrode formed on the semiconductor substrate, a pair of p-type diffusion layers located in the vicinity of the surface of the semiconductor substrate at both sides of the second gate electrode, and a second sidewall formed at both sides of the second gate electrode. In this semiconductor device, the second sidewall includes a sidewall insulating film provided to be in contact with the surface of the semiconductor substrate, and the first sidewall includes a sidewall insulating film and a substrate protection film interposed between the semiconductor substrate and the sidewall insulating film.

In accordance with the present invention, the n-type diffusion layers are protected when the sidewalls are formed. Accordingly, degradation of the characteristics of the n-type FET can be restrained. Thus, a semiconductor device that has an n-type FET with stable characteristics can be provided.

By the method of manufacturing a semiconductor device in accordance with the present invention, the surface of the semiconductor substrate in the n-type FET forming region is protected by the substrate protection film, and degradation due to the stripper or plasma or the like can be restrained in later steps. Accordingly, degradation of the characteristics of the n-type diffusion layers formed in the semiconductor substrate can be restrained. A short-channel effect can also be restricted, and the characteristics of the n-type FET can be improved. Thus, a semiconductor device that exhibits a narrower variation in electric characteristics during the semiconductor manufacturing process can be provided. Meanwhile, in the semiconductor device in accordance with the present invention, the first sidewall of the n-type FET includes a sidewall insulating film and a substrate protection film interposed between the semiconductor substrate and the sidewall insulating film. With this structure, the n-type diffusion layers are protected when the sidewalls are formed. Accordingly, degradation of the characteristics of the n-type FET can be restrained. Thus, a semiconductor device that has an n-type FET with stable characteristics can be provided.

BRIEF DESCRIPTION OF THE DRAWINGS

The above and other objects, advantages and features of the present invention will be more apparent from the following description taken in conjunction with the accompanying drawings, in which:

FIGS. 8I through 8K are process schematic cross-sectional views illustrating the method of manufacturing the semiconductor device in accordance with the first embodiment;

FIGS. 22C and 22D are process schematic cross-sectional views illustrating the method of manufacturing the conventional semiconductor device.

DETAILED DESCRIPTION

Figure 1:
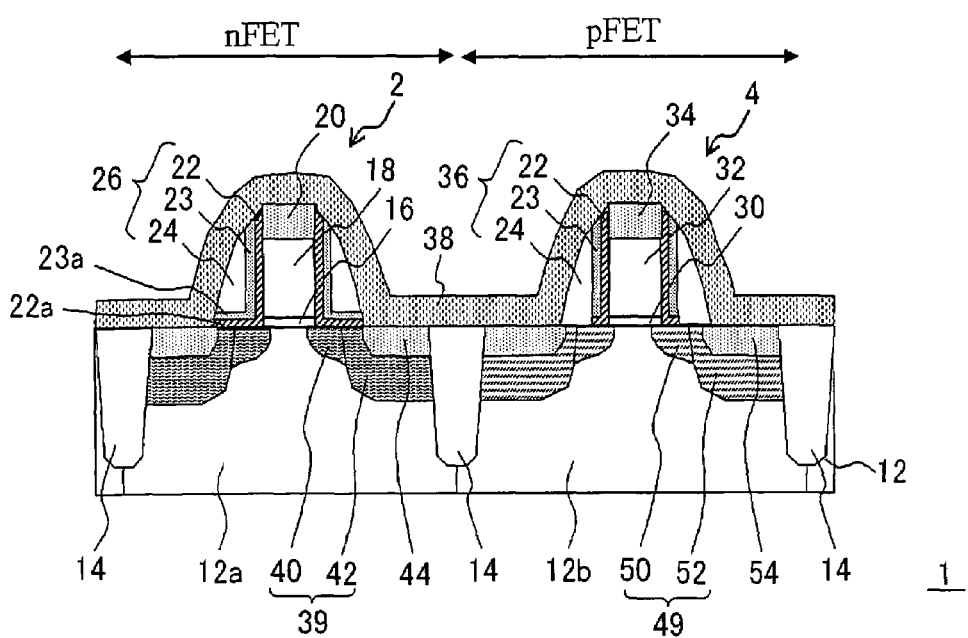
FIG. 1 is a schematic cross-sectional view of a semiconductor device in accordance with a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The following is a description of first through third embodiments of the present invention, with reference to the accompanying drawings. In all the drawings, similar components are denoted by similar reference numerals, and explanation of them is not described herein.

FIRST EMBODIMENT

FIG. 1 is a schematic cross-sectional view of a first embodiment of a semiconductor device in accordance with the present invention.

As shown in FIG. 1, a semiconductor device 1 includes an n-type FET 2 and a p-type FET 4. The n-type FET 2 includes a first gate electrode 18 that is formed on a semiconductor substrate 12, a pair of n-type diffusion layers 39 that are formed in the regions formed in the vicinity of the surface of the semiconductor substrate 12 at both sides of the first gate electrode 18, and first sidewalls 26 that are provided on either side wall of the first gate electrode 18. The p-type FET 4 includes a second gate electrode 32 that is formed on the semiconductor substrate 12, a pair of p-type diffusion layers 49 that are formed in the regions formed in the vicinity of the surface of the semiconductor substrate 12 at both sides of the second gate electrode 32, and second sidewalls 36 that are provided on either side wall of the second gate electrode 32.

The semiconductor device 1 has an n-type FET forming region in which the n-type FET 2 is provided and a p-type FET forming region in which the p-type FET 4 is provided on the semiconductor substrate 12. Those regions are isolated from each other by a device isolation layer 14 formed by STI (Shallow Trench Isolation) or the like in the semiconductor substrate 12. In the drawings, "nFET" indicates the "n-type FET forming region" in which an n-type FET is to be formed or has already been formed, and "pFET" indicates the "p-type FET forming region" in which a p-type FET is to be formed or has already been formed.

In the n-type FET forming region, a p-type well 12a is formed in the semiconductor substrate 12. A pair of n-type diffusion layers 39 and a pair of first silicide layers 44 are formed in the surface region of the p-type well 12a. Each of the n-type diffusion layers 39 includes a first extension region 40 and a first source/drain region 42.

A first gate oxide film 16 and the first gate electrode 18 are stacked on the surface of the semiconductor substrate 12 in the n-type FET forming region. A first silicide layer 20 is formed on the surface layer of the first gate electrode 18. First insulating films 22 that are L-shaped in section are formed along the side walls of the first gate oxide film 16 and the first gate electrode 18 and the surface of the semiconductor substrate 12. A second insulating film 23 that is L-shaped in section is formed on the surface of each of the first insulating films 22. The first insulating films 22 and the second insulating films 23 constitute substrate protection films. Further, first insulating films 22a and second insulating films 23a are formed in this order on the surface of the semiconductor substrate 12. In this structure, the substrate protection films are interposed between the semiconductor substrate 12 and sidewall insulating films 24.

The first insulating films 22 and the second insulating films 23 are made of $SiO_2$, SiN, or the like. The sidewall insulating films 24 are formed so as to cover the surfaces of the second insulating films 23 on the second insulating films 23. The sidewall insulating films 24 are made of $SiO_2$ or the like. The first insulating films 22, the second insulating films 23, and the sidewall insulating film 24 constitute the first sidewalls 26. The end portions of the first insulating films 22 and the second insulating films 23 formed along the surface of the semiconductor substrate 12 are exposed to the outer surfaces of the first sidewalls 26.

On the other hand, in the p-type FET forming region, an n-type well 12b is formed on the semiconductor substrate 12. A pair of p-type diffusion layers 49 and a pair of second silicide layers 54 are formed in the surface region of the n-type sell 12b. Each of the p-type diffusion layers 49 is formed with a second extension region 50 and a second source/drain region 52.

In the p-type FET forming region, the second gate electrode 32 is formed on the surface layer of the semiconductor substrate 12 via a second gate oxide film 30. A second silicide layer 34 is formed on the upper face of the second gate electrode 32. First insulating films 22 and second insulating films 23 are stacked in this order on the side walls of the second gate oxide film 30 and the second gate electrode 32. Further sidewall insulating films 24 are formed on the outer surface of the second insulating film 23. Sidewall insulating films 24 are provided to be in contact with the surface of the semiconductor substrate 12. The first insulating films 22, the second insulating films 23, and the sidewall insulating films 24 constitute the second side walls 36.

Further, a stopper layer 38 that is made of SiN or the like is formed so as to cover all those regions.

Figure 2:
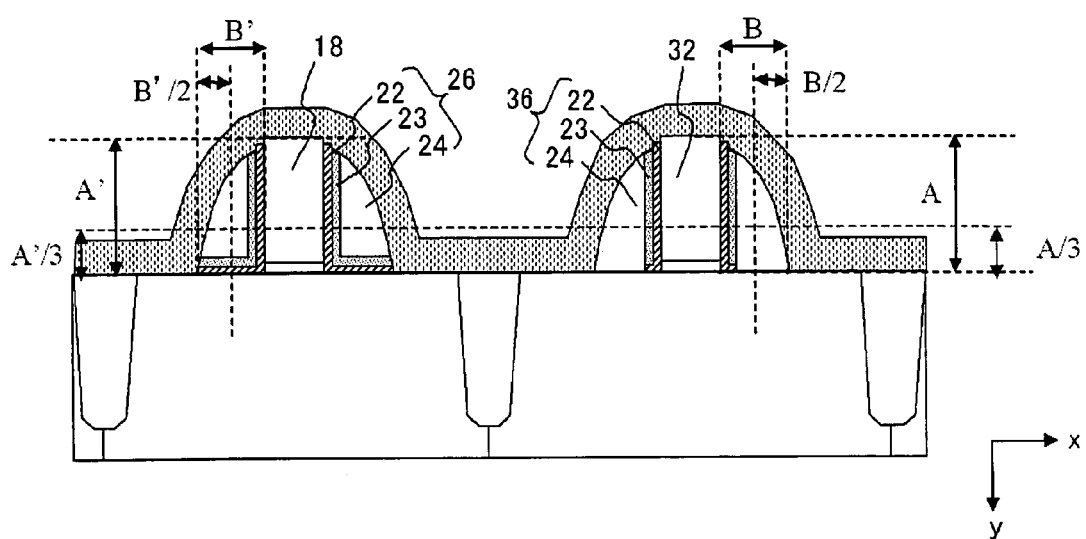
FIG. 2 is a schematic cross-sectional view of the semiconductor device in accordance with the first embodiment.

The structure of the semiconductor device 1 is illustrated in FIG. 2. As shown in FIG. 2, the height of the second gate electrode 32 from the surface of the semiconductor substrate 12 is set as a distance A, and the height of the first gate electrode 18 from the surface of the semiconductor substrate 12 is set as a distance A'. In the ⅓ region of the distance A (or the distance A') from the surface of the semiconductor substrate 12, the first sidewalls 26 and the second sidewalls 36 each have a three-layer structure in the X direction both in the n-type FET 2 and the p-type FET 4. Also, the width of each of the second sidewalls 36 is set as a distance B, and the width of each of the first sidewalls 26 is set as a distance B'. In the ½ region of the distance B (or the distance B'), the second sidewalls 36 each have a single-layer structure in the Y direction, while the first sidewalls 26 each have a three-layer structure in the Y direction.

Figure 5C:
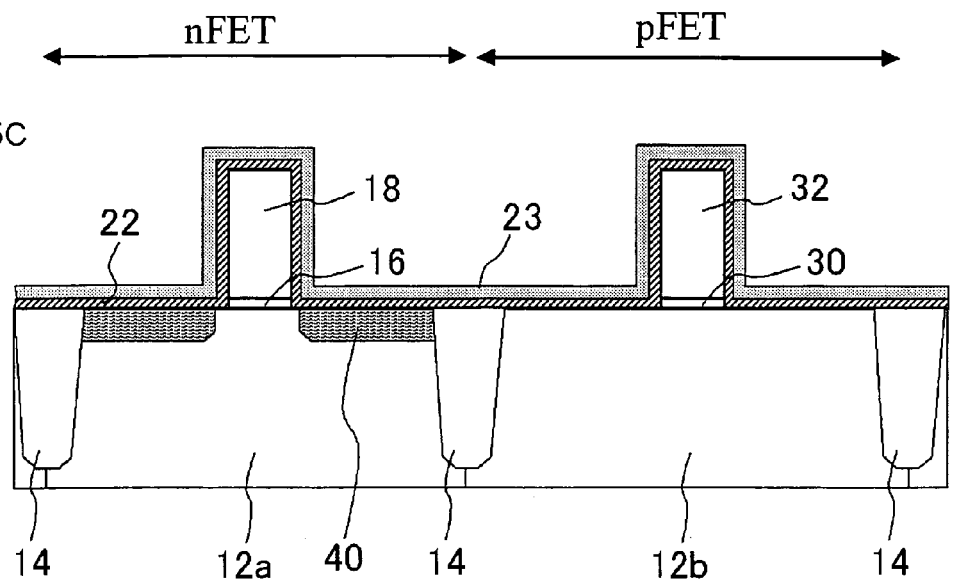
FIGS. 5C and 5D are process schematic cross-sectional views illustrating the method of manufacturing the semiconductor device in accordance with the first embodiment.
Figure 5D:
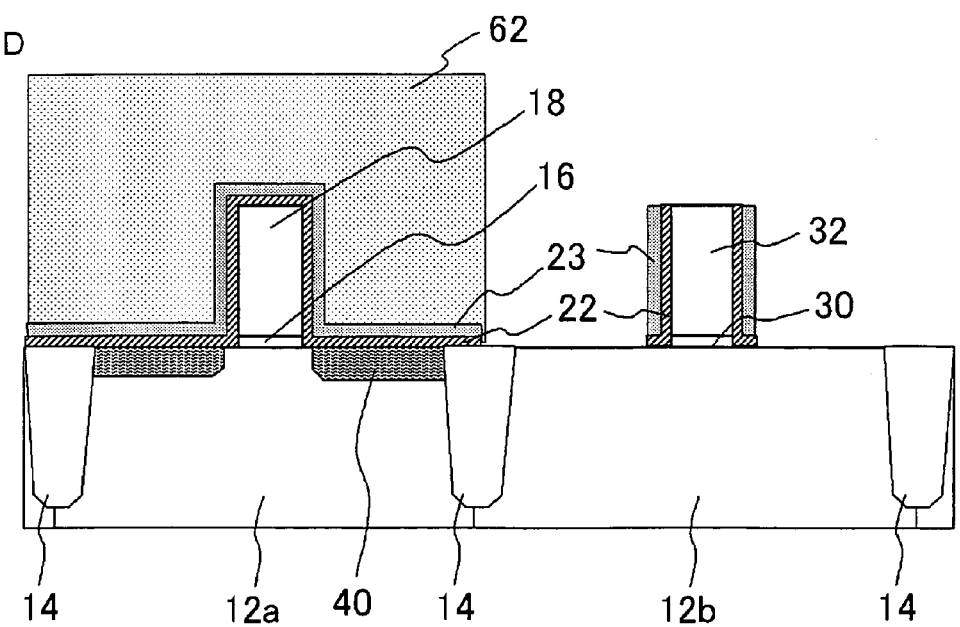
Figure 6E:
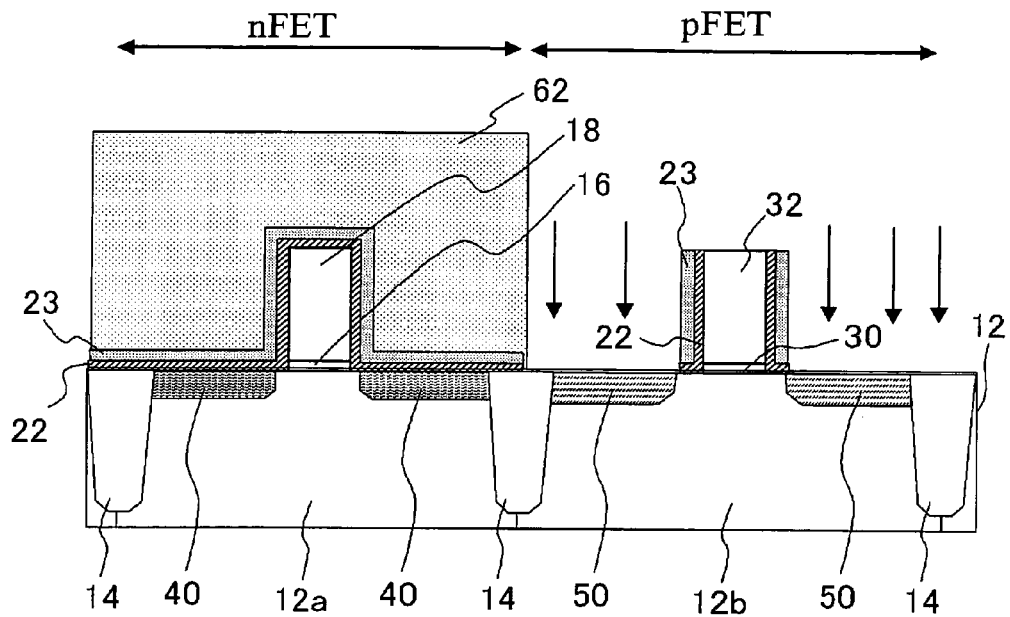
FIGS. 6E and 6F are process schematic cross-sectional views illustrating the method of manufacturing the semiconductor device in accordance with the first embodiment.
Figure 6F:
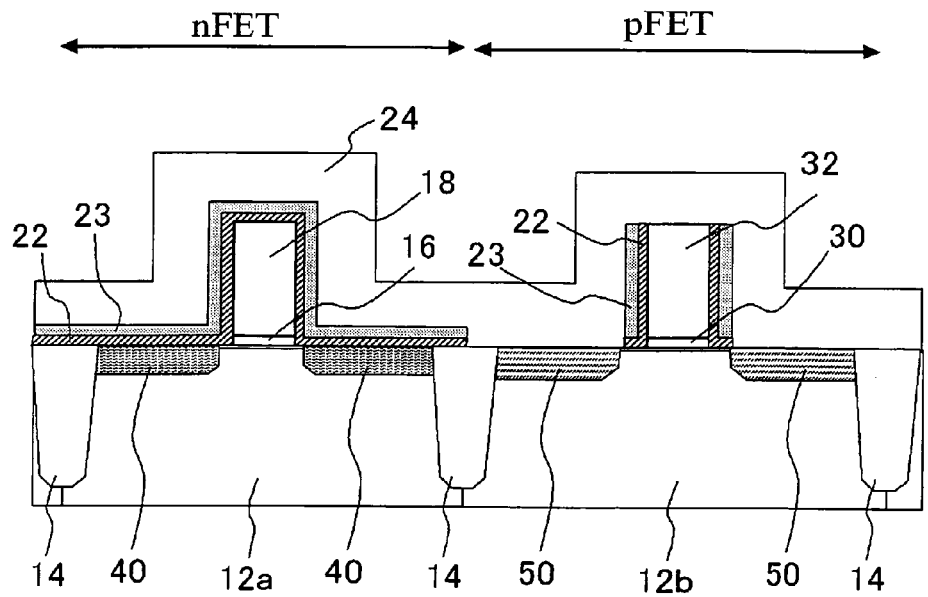

The method of manufacturing the semiconductor device 1 in accordance with the first embodiment includes: the step of forming a substrate protection film (the first insulating film 22 and the second insulating film 23) so as to cover the n-type FET forming region having the first gate electrode 18 formed on the semiconductor substrate 12, and the p-type FET forming region having the second gate electrode 32 formed on the semiconductor substrate 12 (shown in FIGS. 4A through 5C); the step of forming a resist film 62 that is patterned to open the p-type FET forming region after the resist film is formed so as to cover the n-type FET forming region and the p-type FET forming region; the step of exposing the surface of the semiconductor substrate 12 by selectively removing the substrate protection film in the p-type FET forming region so as to leave substrate protection films on the side walls of the second gate electrode 32 (shown in FIG. 5D); the step of forming the pair of second extension regions 50 in the semiconductor substrate 12 in the p-type FET forming region by doping impurities to the semiconductor substrate 12, with the resist film 62, the second gate electrode 32, and the substrate protection films on the second gate electrode 32 serving as masks (shown in FIG. 6E); and the step of removing the resist film 62 formed on the n-type FET forming region (shown in FIGS. 6E and 6F).

In the manufacturing method of this embodiment, the surface of the semiconductor substrate 12 in the n-type FET forming region is protected by the substrate protection films. Accordingly, the surface of the semiconductor substrate 12 in the n-type FET forming region can be effectively protected from the stripper or plasma or the like used for removing the resist film, and also from the cleaning liquid in a washing process. Since the first extension regions 40 and the first source/drain regions 42 are to be formed in the surface layer of the semiconductor substrate 12 in the n-type FET forming region, the surface of the semiconductor substrate 12 is protected so as to restrict degradation of the characteristics of the n-type FET, minimize the "short-channel effect", and improve the characteristics of the n-type FET.

In the following, the method of manufacturing the semiconductor device 1 in accordance with the first embodiment is described in detail, with reference to FIGS. 4A through 8K.

Figure 4A:
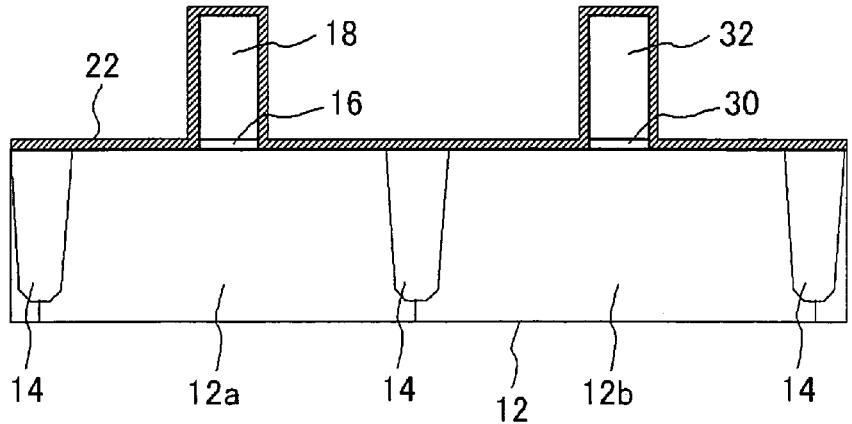
FIGS. 4A and 4B are process schematic cross-sectional views illustrating the method of manufacturing the semiconductor device in accordance with the first embodiment.

First, the semiconductor substrate 12 that has the p-type well 12a and the n-type well 12b separated from each other by a device separation layer 14 is prepared. In the n-type FET forming region, the first gate oxide film 16 is formed on the semiconductor substrate 12 by a conventional method, and the first gate electrode 18 is formed on the first gate oxide film 16. In the p-type FET forming region, the second gate oxide film 30 is formed on the semiconductor substrate 12 by a conventional method, and the second gate electrode 32 is formed on the second gate oxide film 30. The first insulating film 22 is formed so as to cover the n-type FET forming region and the p-type FET forming region (FIG. 4A). The formation of the first insulating film 22 is carried out by thermal oxidization method or CVD method, for example. The first insulating film 22 may be made of $SiO_2$, SiN, or the like. The film thickness of the first insulating film 22 may be 10 angstroms to 150 angstroms, for example.

Figure 4B:
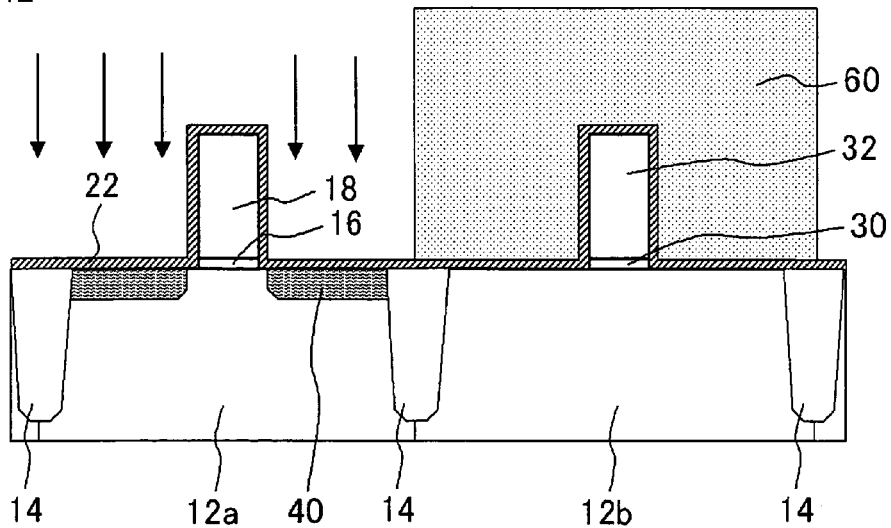

A resist film 60 is then formed to cover the p-type FET forming region. The resist film 60 is patterned to open the n-type FET forming region. The surface layer of the p-type well 12a located immediately below the first insulating film 22 is doped with n-type impurities such as Sb or As, with the first gate electrode 18 and the first insulating film 22 formed on the side walls of the first gate electrode 18 serving as masks. Accordingly, the first source/drain extension regions (hereinafter referred to as the first extension regions) 40 are formed (FIG. 4B). The first extension regions 40 are electric connecting portions between the channel region and the first source/drain regions 42 described later.

The resist film 60 is then removed. At this point, the surfaces of the first extension regions 40 are protected by the first insulating film 22. Accordingly, the surfaces of the first extension regions 40 are not adversely affected by the stripper or plasma or the like used for removing the resist film 60 and the cleaning liquid used in the washing process. The second insulating film 23 is then stacked on the surface of the first insulating film 22 in the n-type FET forming region and the p-type FET forming region (FIG. 5C). The formation of the second insulating film 23 may be carried out by CVD method, for example. The second insulating film 23 may be made of $SiO_2$, SiN, or the like. The film thickness of the second insulating film 23 may be 20 angstroms to 150 angstroms, for example.

The resist film 62 is then formed to cover the n-type FET forming region. The resist film 62 is patterned to open the p-type FET forming region. In the p-type FET forming region, etching is performed, with the second gate electrode 32 and the first insulating film 22 and the second insulating film 23 formed on the side walls of the second gate electrode 32 serving as masks. Through the etching, the first insulating film 22 and the second insulating film 23 formed on the surface of the semiconductor substrate 12 are removed. In this manner, the surface of the semiconductor substrate 12 is exposed in the p-type FET forming region, and the stacked structure of the first insulating film 22 and the second insulating film 23 is left only on the side walls of the second gate oxide film 30 and the second gate electrode 32 (FIG. 5D).

Next, the exposed surface layer of the semiconductor substrate 12 is doped with p-type impurities such as B or $BF_2$, with the second gate electrode 32 and the first insulating film 22 and the second insulating film 23 formed on the side walls of the second gate electrode 32 serving as masks. Accordingly, the second source/drain extension regions (hereinafter referred to as the second extension regions) 50 are formed in surface layer of N type well 12b(FIG. 6E) The second extension regions 50 are electric connecting portions between the channel region and the second source/drain regions 52 described later.

The resist film 62 formed on the semiconductor substrate 12 in the n-type FET forming region is then removed. At this point, the surfaces of the first extension regions 40 are protected by the first insulating film 22 and the second insulating film 23. Accordingly, the surfaces of the first extension regions 40 are not adversely affected by the stripper or plasma or the like used for removing the resist film 62 and the cleaning liquid used in the washing process.

Figure 7G:
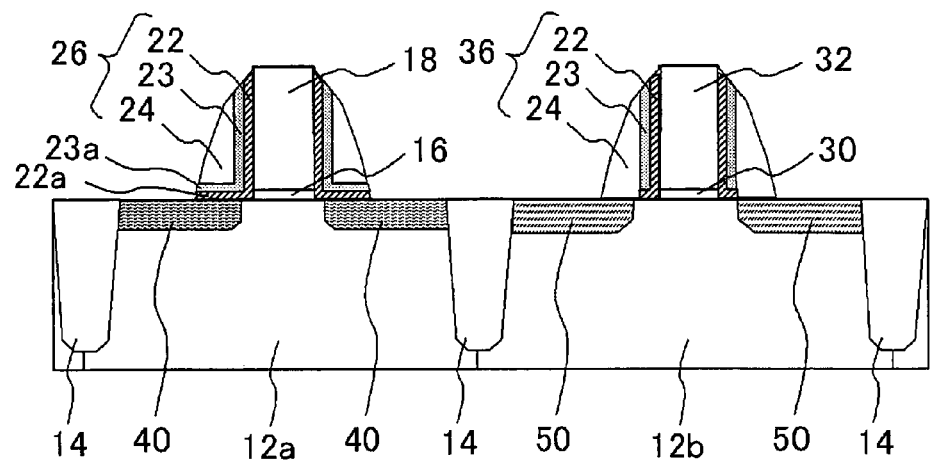
FIGS. 7G and 7H are process schematic cross-sectional views illustrating the method of manufacturing the semiconductor device in accordance with the first embodiment.

The sidewall insulating film 24 is then formed to cover the n-type FET forming region and the p-type FET forming region (FIG. 6F). Etchback is then performed so as to form the first sidewalls 26 and the second sidewalls 36 (FIG. 7G). Each of the first sidewalls 26 is formed with the first insulating film 22, the second insulating film 23, and the sidewall insulating film 24. The first insulating film 22 of each of the first sidewalls 26 is formed along side walls of the first gate oxide film 16 and the first gate electrode 18, and is L-shaped in section so as to cover part of the surface of the semiconductor substrate 12. On the other hand, the second insulating film 23 of each of the first sidewalls 26 is formed on the surface of the first insulating film 22 of the first sidewall 26, and is L-shaped in section. The sidewall insulating film 24 of each of the first sidewalls 26 is formed so as to cover the surface of the second insulating film 23 of the first sidewall 26, and has a fan-like shape in section. Meanwhile, each of the second sidewalls 36 is formed with the first insulating film 22, the second insulating film 23, and the sidewall insulating film 24. The first insulating film 22 of each of the second sidewalls 36 is formed on side walls of the second gate oxide film 30 and the second gate electrode 32, and the second insulating film 23 of each of the second sidewalls 36 is formed on the surface of the first insulating film 22 of the second sidewall 36. The sidewall insulating film 24 of each of the second sidewalls 36 is formed so as to cover the surface of the second insulating film 23 of the second sidewall 36 and part of the surface of the semiconductor substrate 12, and has a fan-like shape in section.

Figure 7H:
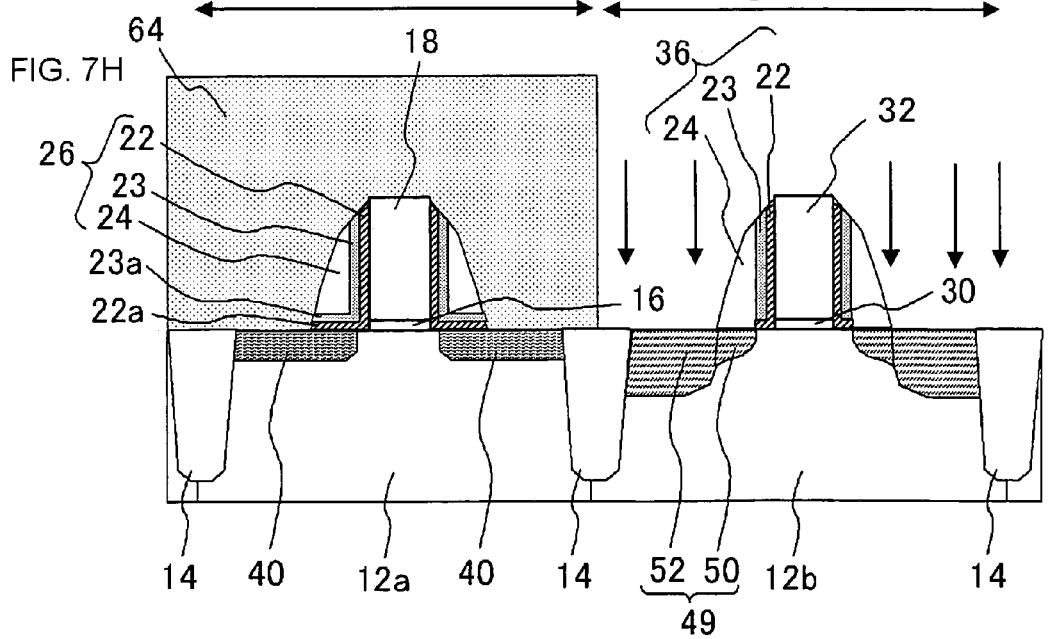

The n-type FET forming region is then covered with a resist film 64. The resist film 64 is patterned to open the p-type FET forming region. With the second gate electrode 32 and the second sidewalls 36 serving as masks in the p-type FET forming region, the semiconductor substrate 12 is doped with p-type impurities such as B, so as to form the pair of second source/drain regions 52 (FIG. 7H).

After the resist film 64 formed in the n-type FET forming region is removed, a resist film 66 is formed in the p-type FET forming region. The resist film 66 is patterned to open the n-type FET forming region. With the first gate electrode 18 and the first sidewalls 26 serving as masks in the n-type FET forming region, the semiconductor substrate 12 is doped with n-type impurities such as As or P, so as to form the pair of first source/drain regions 42 (FIG. 8I).

The resist film formed in the p-type FET forming region is then removed, and annealing is performed so as to activate the impurities in the diffusion layers (FIG. 8J). First silicide layers and second silicide layers are then formed in the n-type FET forming region and the p-type FET forming region by a conventional method. In the n-type FET forming region, the pair of silicide layers 44 are formed in the semiconductor substrate 12, with the first gate electrode 18 and the first sidewalls 26 serving as masks. Here, the first silicide layer 20 is also formed on the upper face of the first gate electrode 18. In the p-type FET forming region, the pair of second silicide layers 54 are formed in the semiconductor substrate 12, with the second gate electrode 32 and the second sidewalls 36 serving as masks. Here, the second silicide layer 34 is also formed on the upper face of the second gate electrode 32. Further, the stopper layer 38 that is made of SiN or the like is formed so as to cover the n-type FET forming region and the p-type FET forming region, thereby completing the semiconductor device 1 (FIG. 8K).

In the semiconductor device 1 of the first embodiment, the first sidewalls 26 forming the n-type FET 2 have the substrate protection film (the first insulating film 22a and the second insulating film 23a) interposed between the semiconductor substrate 12 and the sidewall insulating films 24. When the first sidewalls 26 are formed, the first extension regions 40 can be protected, and degradation of the characteristics of the n-type FET 2 can be restrained. Thus, the semiconductor device 1 can have the n-type FET 2 with stable characteristics.

In the semiconductor device 1 manufactured by the above described manufacturing method, the first sidewalls 26 are provided in the n-type FET 2. With the particular structure of the first sidewalls 26, various functions can be provided in the semiconductor device 1 according to the present embodiment. Conventionally, sidewalls were formed on the sides of a gate electrode by etchback during the process of manufacturing a semiconductor device. Therefore, any special effects were not expected by making the design of sidewalls special. With this situation in mind, the inventor made intensive studies to find that the first sidewalls 26 having particular structures could add various functions to the n-type FET 2. The particular effects can be achieved by the substrate protection films forming the first sidewalls 26.

In this embodiment, the substrate protection films formed on the surface of the semiconductor substrate 12 are each formed with a stacked structure of the first insulating film 22a and the second insulating film 23a. Such a stacked structure allows various combinations of materials, and thus can provide desired functions. A higher degree of freedom is also allowed in the design of the first sidewalls 26.

More specifically, the first insulating film 22 may be a $SiO_2$ film that is formed through thermal oxidation method. The $SiO_2$ film formed in this way is a dense film, and can effectively protect the first extension regions 40. Accordingly, degradation of the characteristics of the n-type FET 2 can be prevented during the process of manufacturing the semiconductor device 1. Also, the second insulating film 23 can be formed with a SiN film. With this structure, desired stress can be applied to the semiconductor substrate. Accordingly, an ON current can be increased in the n-type FET forming region, so as to improve the performance of the n-type FET. Furthermore, as the second insulating film 23a is provided on the surface of the semiconductor substrate 12, the stress control by the second insulating film 23a can be made easier. Also, with the second insulating film 23a being provided in that position, the stress control by the second insulating film 23a can be readily performed even if the thickness of the second insulating film 23a is small. In addition to the above, various functions can be added to the first sidewalls 26 by combining various materials, and a higher degree of freedom can be allowed in design.

On the other hand, in the p-type FET forming region, the sidewall insulating films 24 are provided to be in contact with the surface of the semiconductor substrate 12, and the substrate protection films (the first insulating films 22 and the second insulating films 23) are formed only on the sides of the second gate electrode 32. This is because p-type impurities are lighter elements than n-type impurities, can scatter deeper into a semiconductor substrate, and hardly cause a problem from deterioration of the surface of a p-type diffusion layer. Furthermore, p-type impurities have low reactivity with any stripper or cleaning liquid, and are chemically stable. Accordingly, a problem due to deterioration of the surface of a p-type diffusion layer is hardly caused. Moreover, since the p-type diffusion layers are formed after the formation of the n-type diffusion layers in the semiconductor forming process, the p-type diffusion layers are less affected than the n-type diffusion layers in the etching step, the resist film removing step, and the washing step. Based on those facts, the inventor made studies to find that the second sidewalls 36 should have the sidewall insulating films 24 provided to be in contact with the surface of the semiconductor substrate 12 while the first sidewalls 26 should have the sidewall insulating films 24 and the substrate protection films (the first insulating films 22a and the second insulating films 23a) interposed between the semiconductor substrate 12 and the sidewall insulating films 24, so that degradation of the characteristics of the n-type FET 2 could be prevented without adverse influence on the characteristics of the p-type FET 4.

By the method of manufacturing the semiconductor device 1 in accordance with the first embodiment, the first insulating film 22 is formed on the surface of the first extension regions 40, as shown in FIG. 4B. Accordingly, when the resist film 60 is removed in the steps illustrated in FIGS. 4B and 5C, the first extension regions 40 are not adversely affected by the stripper or plasma or the like used for removing the resist film 60 and the cleaning liquid used in the washing step.

Also, as shown in FIG. 6E, the first insulating film 22 and the second insulating film 23 are stacked on the surface of the first extension regions 40. Accordingly, when the resist film 62 is removed in the steps illustrated FIGS. 6E and 6F, the first extension regions 40 are not adversely affected by the stripper or plasma or the like used for removing the resist film 62 and the cleaning liquid used in the washing step.

By the manufacturing method in accordance with this embodiment, deterioration can be prevented as the substrate surface formed with the first extension regions 40 are protected by the insulating films. By this method, degradation of the characteristics of the n-type FET can be restrained. Accordingly, a short-channel effect in the n-type FET forming region can be restrained, and the characteristics of the n-type FET can be improved. Thus, a semiconductor device that has small variations in electric characteristics can be provided by the above described manufacturing method.

SECOND EMBODIMENT

Figure 3:
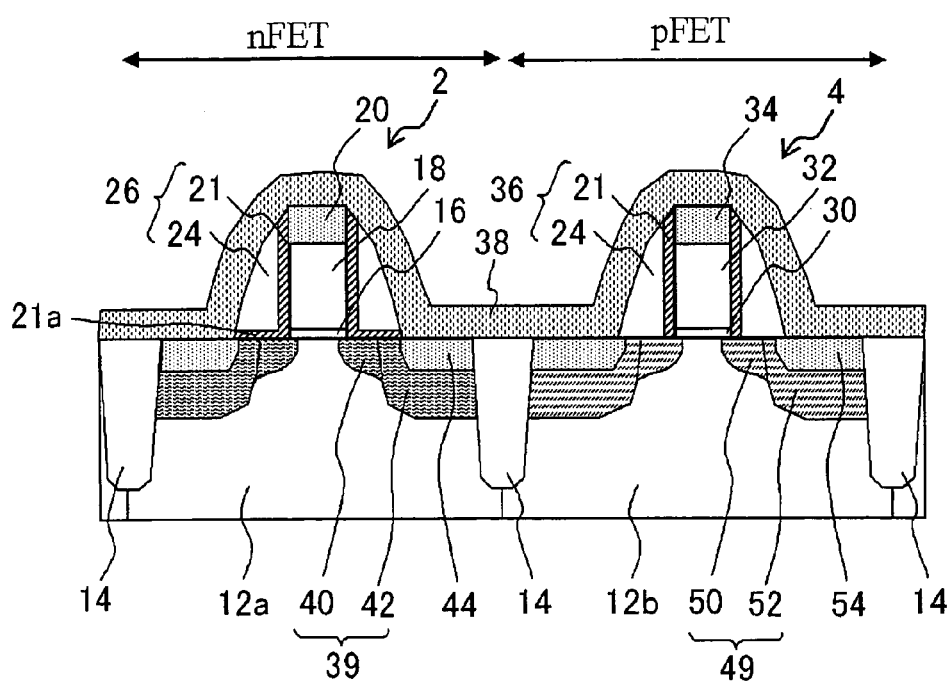
FIG. 3 is a schematic cross-sectional view of a semiconductor device in accordance with a second embodiment of the present invention.

FIG. 3 is a schematic cross-sectional view of a second embodiment of a semiconductor device in accordance with the present invention.

The semiconductor device 1 of the second embodiment differs from the semiconductor device 1 of the first embodiment only in the structures of the first sidewalls 26 and the second sidewalls 36. In the following, only the first sidewalls 26 and the second sidewalls 36 will be described, and explanation of the other parts will not be described.

As shown in FIG. 3, the first sidewalls 26 are each formed with a first insulating film 21 that forms a substrate protection film and a sidewall insulating film 24. Each first insulating film 21 is formed along side walls of a first gate oxide film 16 and a first gate electrode 18 and the surface of the semiconductor substrate 12. The first insulating film 21 is L-shaped in section. In this structure, first insulating films 21a are formed on the surface of the semiconductor substrate 12. The sidewall insulating films 24 are formed so as to cover the first insulating films 21. The end portion of each of the first insulating films 21a is exposed through the outer surface of the corresponding first sidewall 26. The first insulating films 21 may be made of $SiO_2$, SiN, or the like. The thickness of each of the first insulating films 21 may be 10 angstroms to 150 angstroms, for example.

Figure 10C:
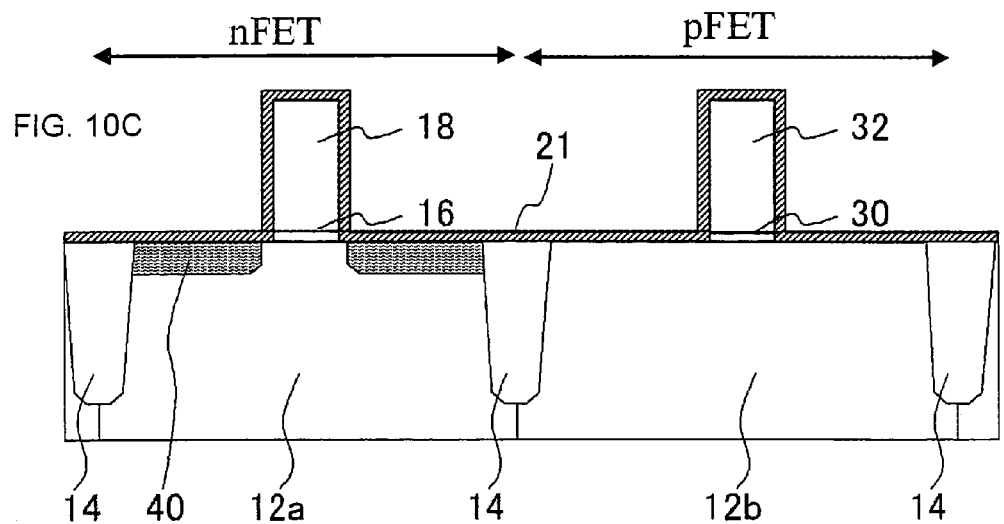
FIGS. 10C and 10D are process schematic cross-sectional views illustrating the method of manufacturing the semiconductor device in accordance with the second embodiment.
Figure 10D:
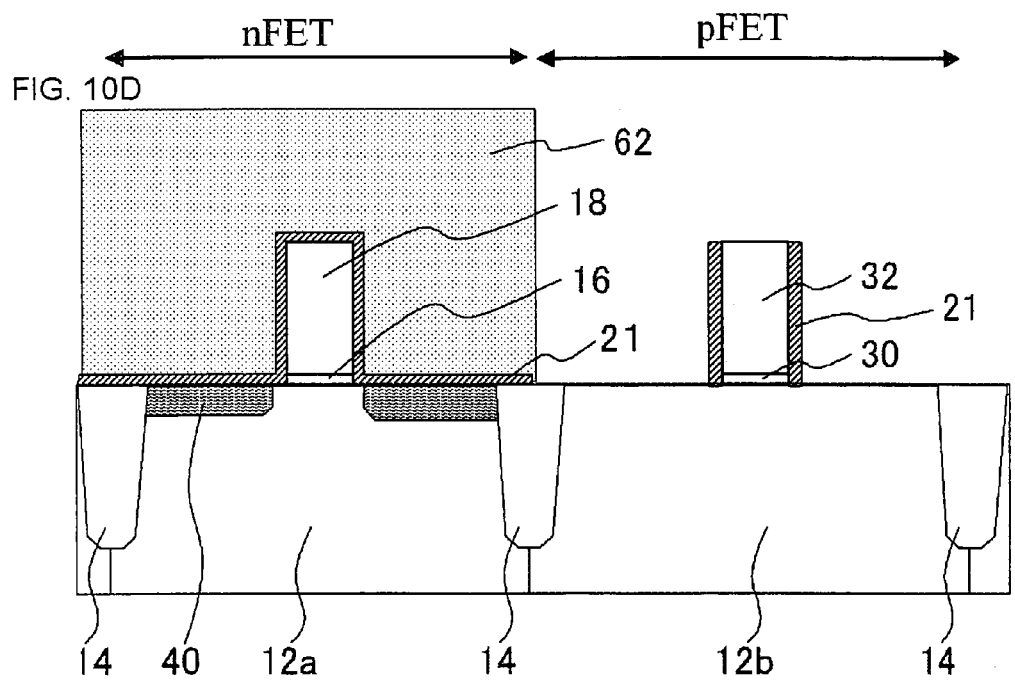
Figure 11E:
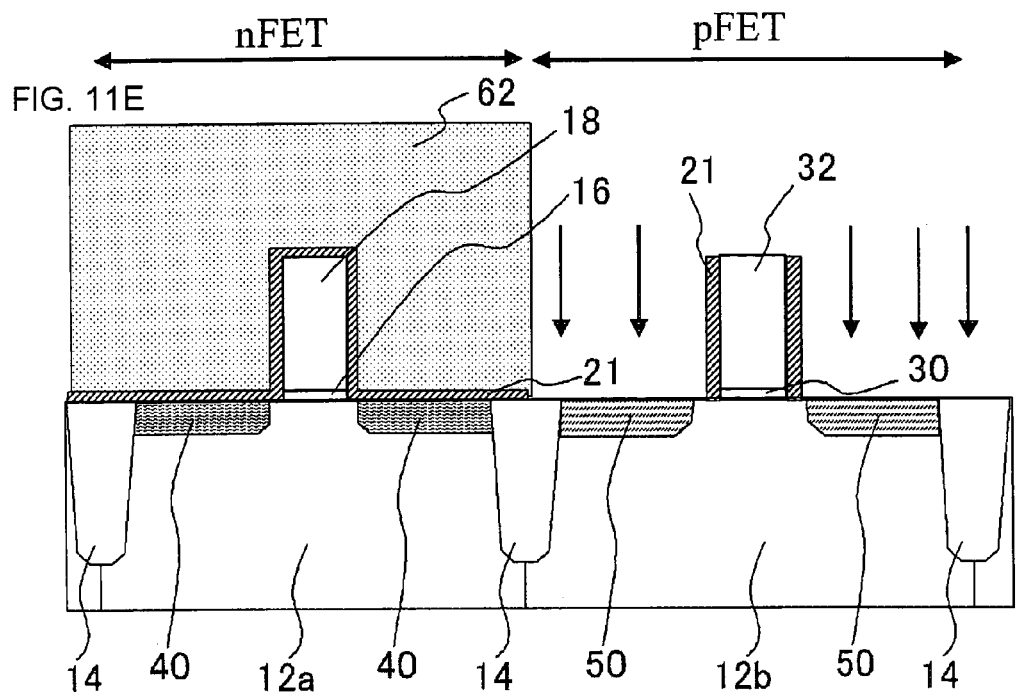
FIGS. 11E and 11F are process schematic cross-sectional views illustrating the method of manufacturing the semiconductor device in accordance with the second embodiment.
Figure 11F:
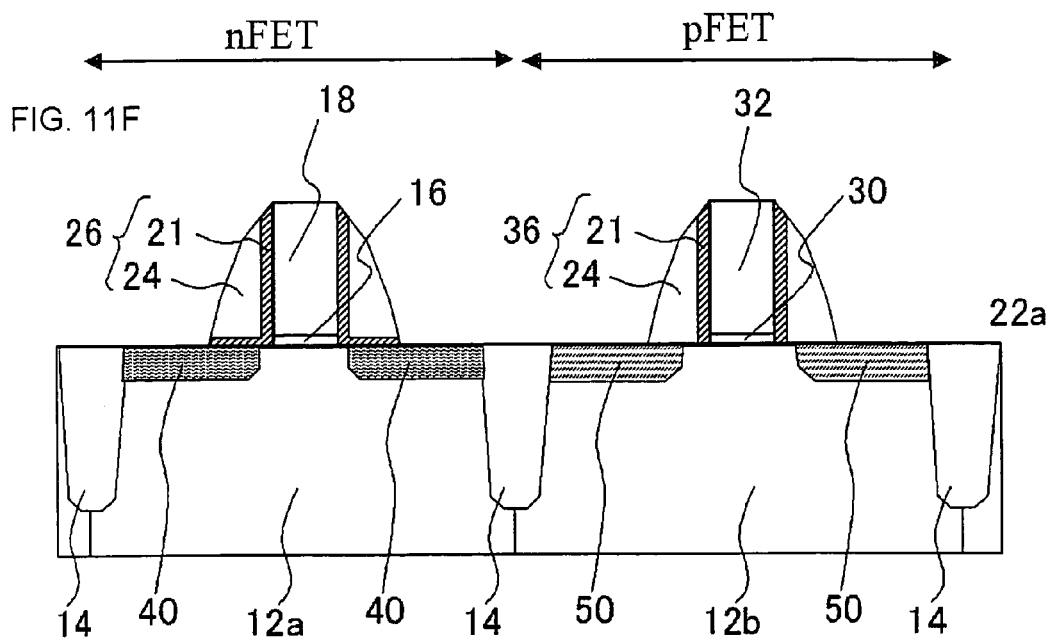

The method of manufacturing the semiconductor device 1 in accordance with the second embodiment includes: the step of forming substrate protection films (the first insulating films 21) so as to cover the n-type FET forming region having the first gate electrode 18 formed on the semiconductor substrate 12 and the p-type FET forming region having a second gate electrode 32 formed on the semiconductor substrate 12 (shown in FIGS. 9A through 10C); the step of opening the p-type FET forming region by patterning a resist film after the resist film is formed so as to cover the n-type FET forming region and the p-type FET forming region; the step of exposing the surface of the semiconductor substrate 12 by selectively removing the substrate protection film (the first insulating film 21) in the p-type FET forming region so as to leave substrate protection films on the side walls of the second gate electrode 32 (shown in FIG. 10D); the step of forming a pair of second extension regions 50 in the semiconductor substrate 12 in the p-type FET forming region by doping impurities to the semiconductor substrate 12, with a resist film 62, the second gate electrode 32, and the substrate protection films on the second gate electrode 32 serving as masks (shown in FIG. 1E); and the step of removing the resist film 62 formed in the n-type FET forming region (shown in FIGS. 11E and 11F).

In the manufacturing method of this embodiment, the surface of the semiconductor substrate 12 in the n-type FET forming region is protected by the substrate protection film (the first insulating film 21). Accordingly, the surface of the semiconductor substrate 12 in the n-type FET forming region can be effectively protected from the stripper or plasma or the like used for removing the resist film, and also from the cleaning liquid in the washing process. Since the first extension regions 40 and the first source/drain regions 42 are to be formed in the vicinity of the surface layer of the semiconductor substrate 12 in the n-type FET forming region, the surface of the semiconductor substrate 12 is protected so as to restrict degradation of the characteristics of the n-type FET, minimize the "short-channel effect", and improve the characteristics of the n-type FET in the semiconductor device 1.

In the following, the method of manufacturing the semiconductor device 1 in accordance with the second embodiment is described in detail, with reference to FIGS. 9A through 12H.

Figure 9A:
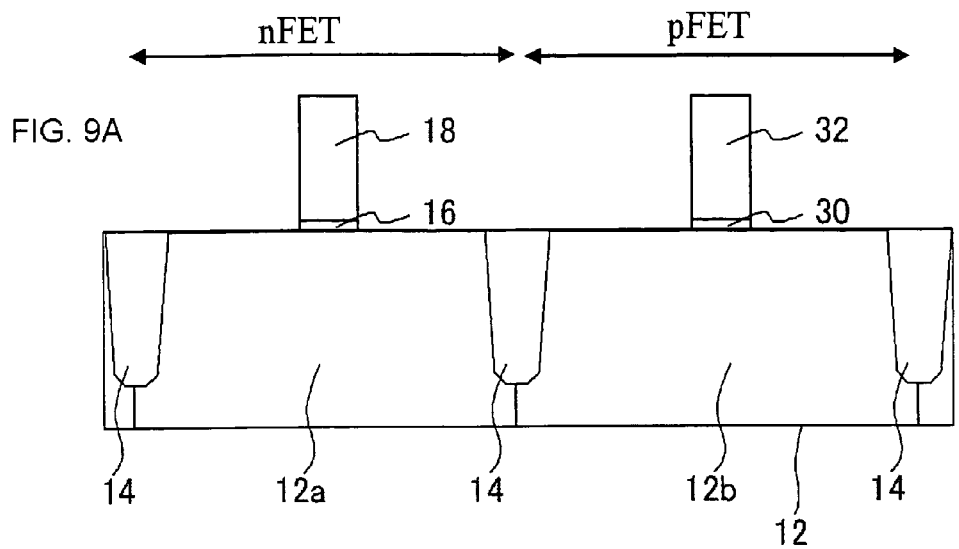
FIGS. 9A and 9B are process schematic cross-sectional views illustrating the method of manufacturing the semiconductor device in accordance with the second embodiment.

First, the semiconductor substrate 12 that has a p-type well 12a and an n-type well 12b separated from each other by a device separation layer 14 is prepared. In the n-type FET forming region, the first gate oxide film 16 is formed on the semiconductor substrate 12 by a conventional method, and the first gate electrode 18 is formed on the first gate oxide film 16. In the p-type FET forming region, the second gate oxide film 30 is formed on the semiconductor substrate 12 by a conventional method, and the second gate electrode 32 is formed on the second gate oxide film 30 (FIG. 9A).

Figure 9B:
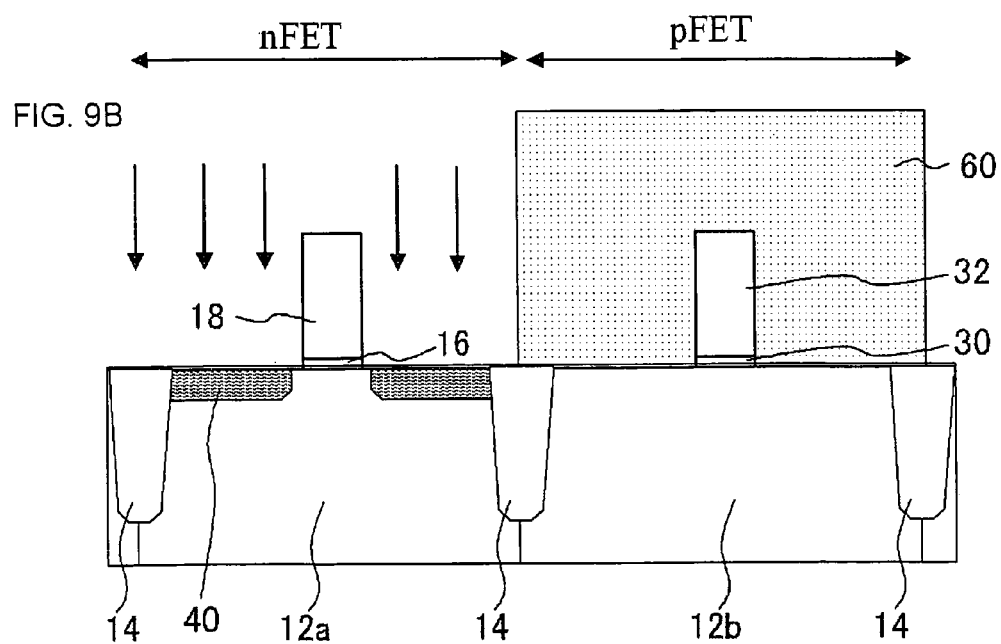

A resist film 60 is then formed to cover the p-type FET forming region. The resist film 60 is patterned so as to open the n-type FET forming region. The surface layer of the p-type well 12a is doped with n-type impurities such as Sb or As, with the first gate electrode 18 serving as a mask on the p-type well 12a. Accordingly, the first source/drain extension regions (hereinafter referred to as the first extension regions) 40 are formed (FIG. 9B).

The resist film 60 is then removed. The first insulating film 21 is formed in the n-type FET forming region and the p-type FET forming region (FIG. 10C). The formation of the first insulating film 21 may be carried out through thermal oxidization method or CVD method, for example. The first insulating film 21 may be made of $SiO_2$, SiN, or the like. The thickness of the first insulating film 21 may be 10 angstroms to 150 angstroms, for example.

The resist film 62 is then formed to cover the n-type FET forming region. The resist film 62 is patterned so as to open the p-type FET forming region. In the p-type FET forming region, etching is performed, with the second gate electrode 32 and the first insulating film 21 formed on the side walls of the second gate electrode 32 serving se masks. Through the etching, the first insulating film 21 formed on the surface of the semiconductor substrate 12 is removed. In this manner, the surface of the semiconductor substrate 12 is exposed in the p-type FET forming region, and the first insulating film 21 is left only on the side walls of the second gate oxide film 30 and the second gate electrode 32 (FIG. 10D).

Next, the exposed surface layer of the semiconductor substrate 12 is doped with p-type impurities such as B or $BF_2$, with the second gate electrode 32 and the first insulating film 21 formed on the side walls of the second gate electrode 32 serving as masks. Accordingly, the second extension regions 50 are formed in the surface layer of the n-type well 12b (FIG. 11E).

The resist film 62 formed on the semiconductor substrate 12 in the n-type FET forming region is then removed. At this point, the surfaces of the first extension regions 40 are protected by the first insulating film 21. Accordingly, the first extension regions 40 are not adversely affected by the stripper or plasma or the like used for removing the resist film 62 and the cleaning liquid used in the washing process.

An insulating film (not shown) is then formed so as to cover the n-type FET forming region and the p-type FET forming region. Etchback is then performed to form the first sidewalls 26 and the second sidewalls 36 (FIG. 11F). Each of the first sidewalls 26 is formed with the first insulating film 21 and the sidewall insulating film 24. The first insulating film 21 of each of the first sidewalls 26 is formed along the side walls of the first gate oxide film 16 and the first gate electrode 18 and the surface of the semiconductor substrate 12. The first insulating film 21 is L-shaped in section. The sidewall insulating film 24 of each of the first sidewalls 26 is formed so as to cover the surface of the first insulating film 21 of the first sidewall 26, and has a fan-like shape in section. Meanwhile, each of the second sidewalls 36 is also formed with the first insulating film 21 and the sidewall insulating film 24. The first insulating film 21 of each of the second sidewalls 36 is formed on the side walls of the second gate oxide film 30 and the second gate electrode 32. The sidewall insulating film 24 of each of the second sidewalls 36 is formed so as to cover the first insulating film 21 of the second sidewall 36 and part of the surface of the semiconductor substrate 12, and has a fan-like shape in section.

Figure 12G:
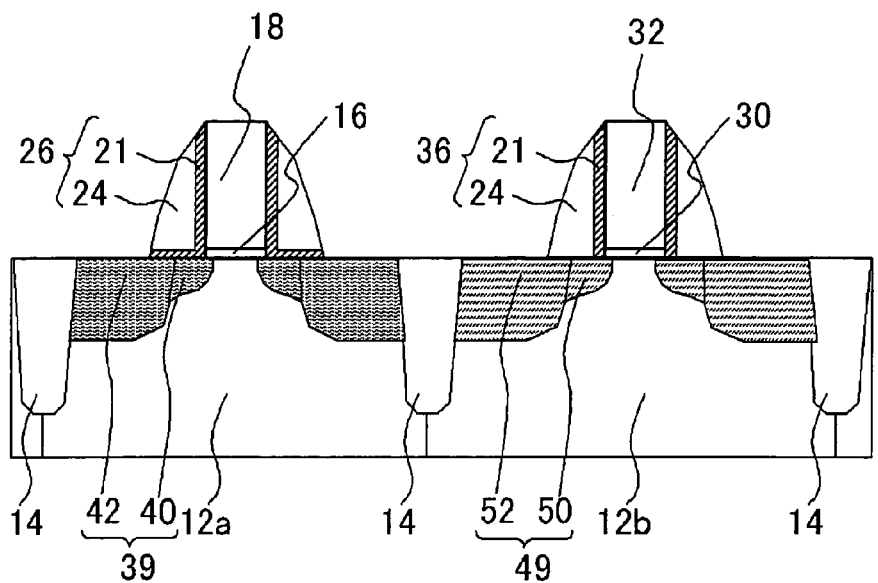
FIGS. 12G and 12H are process schematic cross-sectional views illustrating the method of manufacturing the semiconductor device in accordance with the second embodiment.
Figure 12H:
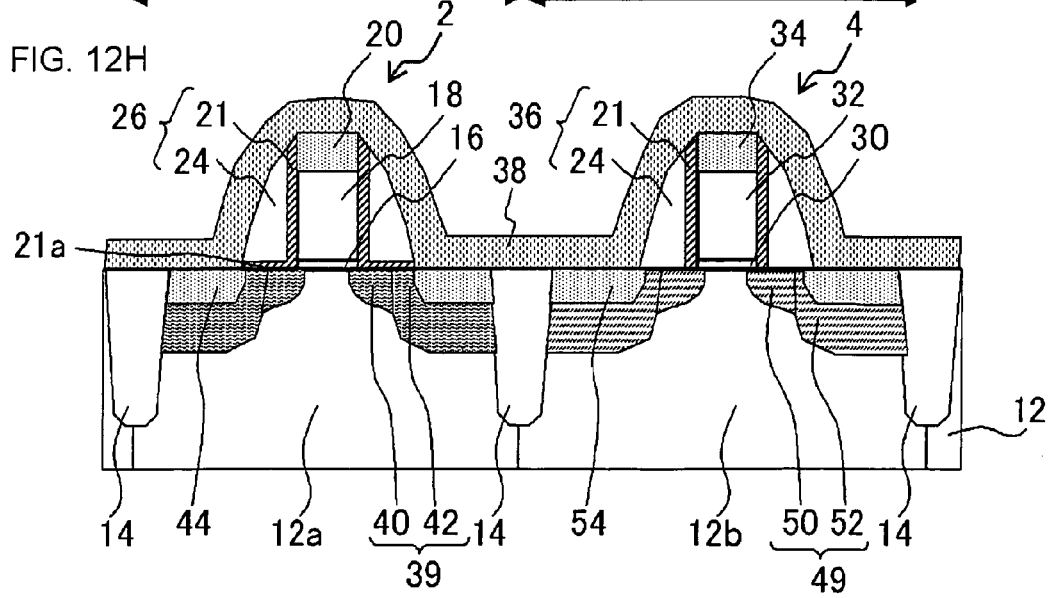

After the first sidewalls 26 and the second sidewalls 36 are formed, the semiconductor device 1 is completed in the same manner as in the first embodiment (FIGS. 12G and 12H). Here, the same procedures as those illustrated in FIGS. 7H through 8K are carried out.

In the semiconductor device 1 of the second embodiment manufactured by the above described method, the first sidewalls 26 forming the n-type FET 2 have the substrate protection films (the first insulating films 21a) interposed between the semiconductor substrate 12 and the sidewall insulating films 24. When the first sidewalls 26 are formed, the first extension regions 40 can be protected, and degradation of the characteristics of the n-type FET 2 can be restrained. Thus, the semiconductor device 1 can have an n-type FET with stable characteristics.

Also, each first insulating film 21 may be a $SiO_2$ film that is formed through thermal oxidization method. The $SiO_2$ film formed in this way is a dense film, and can effectively protect the first extension regions 40. Thus, the above described effects can be more emphasized.

By the method of manufacturing the semiconductor device 1 in accordance with the second embodiment, the first insulating film 21 is formed on the surface of the first extension regions 40, as shown in FIG. 11E. Accordingly, when the resist film 62 is removed in the steps illustrated in FIGS. 11E and 11F, the first extension regions 40 are not adversely affected by the stripper or plasma or the like used for removing the resist film 60 and the cleaning liquid used in the washing step.

By the manufacturing method in accordance with this embodiment, deterioration can be prevented as the substrate surface having the first extension regions 40 are protected by the first insulating films 21. By this method, degradation of the characteristics of the n-type FET can be restrained. Accordingly, a short-channel effect in the n-type FET forming region can be restrained, and the characteristics of the n-type FET can be improved. Thus, a semiconductor device that has very small variations in electric characteristics can be provided by the above described manufacturing method. Furthermore, since the substrate protection film is formed only with the first insulating film 21 in this embodiment, the number of manufacturing steps can be made less than that in the first embodiment. Also, the manufacturing time can be shortened, and the initial cost can be lowered.

THIRD EMBODIMENT

In each of the foregoing embodiments, the semiconductor device 1 has a core forming region that includes an n-type FET forming region and a p-type FET forming region (the core forming region may also include a SRAM forming region). In a third embodiment of the present invention, the semiconductor device 1 includes an I/O forming region and the core forming region (third embodiment). In this structure, each of the regions may include an n-type FET forming region and a p-type FET forming region. In the core forming region of this embodiment, a substrate protection film is provided in the n-type FET, while a substrate protection film is not provided in the p-type FET. In the I/O forming region, a substrate protection film is provided both in the n-type FET and the p-type FET. In the drawings, "CORE" indicates the "core forming region" in which a core region is to be formed or has already been formed, and "I/O" indicates the "I/O forming region" in which an I/O region is to be formed or has already been formed.

In the following, the method of manufacturing the semiconductor device 1 in accordance with the third embodiment is described, with reference to FIGS. 13A through 18L. However, explanation of the structure of the semiconductor device 1 will not be described.

Figure 13A:
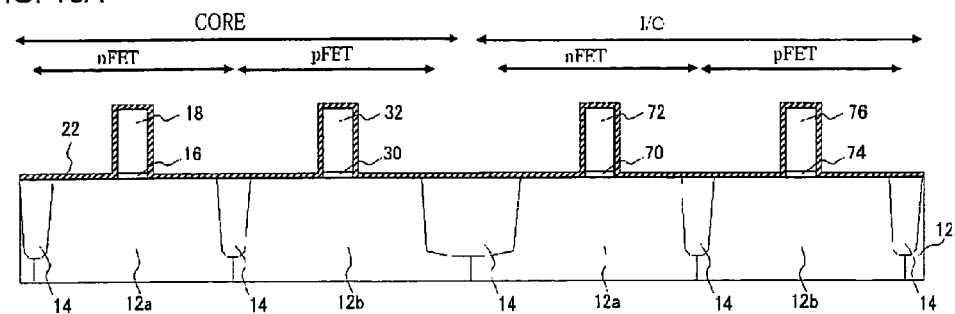
FIGS. 13A and 13B are process schematic cross-sectional views illustrating the method of manufacturing the semiconductor device in accordance with a third embodiment of the present invention.

First, a semiconductor substrate 12 that has a core forming region and an I/O forming region separated from each other by a device isolation layer 14 is prepared. In the core forming region, a p-type well 12a and an n-type well 12b are separated from each other by a device separation layer 14. In this manner, an n-type FET forming region and a p-type FET forming region are formed. While, in the I/O forming region, a p-type well 12a and an n-type well 12b are also separated from each other by a device isolation layer 14. In this manner, an n-type FET forming region and ap-type FET forming region are formed. In each of the n-type FET forming region and the p-type FET forming region in the core forming region, a gate oxide film and a gate electrode are stacked on the semiconductor substrate 12, as in each of the foregoing embodiments. In the n-type FET forming region in the I/O forming region, a third gate oxide film 70 and a third gate electrode 72 are stacked on the semiconductor substrate 12. In the p-type FET forming region, a fourth gate oxide film 74 and a fourth gate electrode 76 are stacked on the semiconductor substrate 12. Further, a first insulating film 22 is formed so as to cover the core forming region and the I/O forming region (FIG. 13A).

Figure 13B:
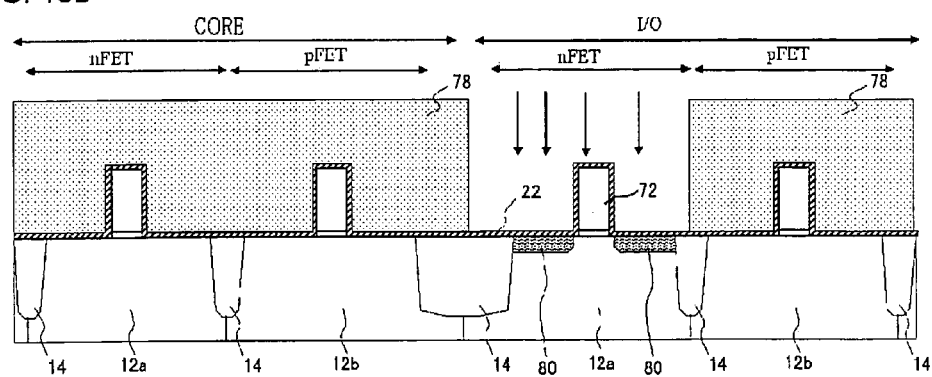

A resist film 78 that is patterned so as to open the n-type FET forming region in the I/O forming region is provided to cover the core forming region and the I/O forming region. The surface layer of the p-type well 12a located immediately below the first insulating film 22 is doped with n-type impurities such as Sb or As, with the third gate electrode 72 and the first insulating film 22 formed on the side walls of the third gate electrode 72 serving as masks. Accordingly, third source/drain extension regions (hereinafter referred to as the third extension regions) 80 are formed (FIG. 13B).

Figure 14C:
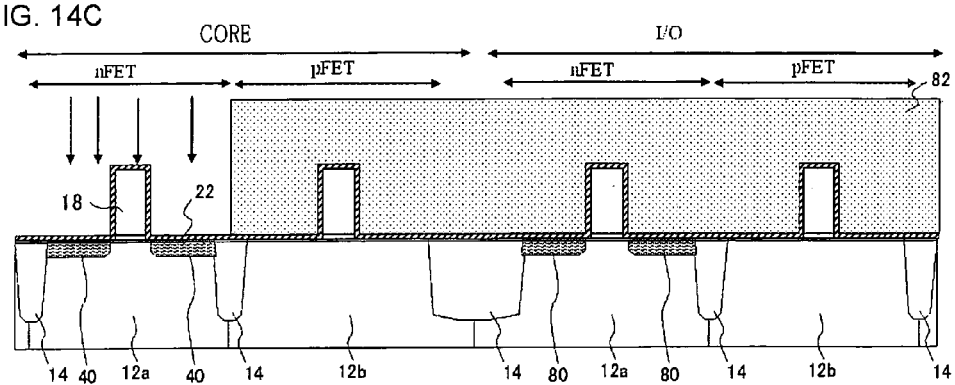
FIGS. 14C and 14D are process schematic cross-sectional views illustrating the method of manufacturing the semiconductor device in accordance with the third embodiment.

The resist film 78 is then removed. A resist film 82 that is patterned to open the n-type FET forming region of the core forming region is provided to cover the core forming region and the I/O forming region. With the first gate electrode 18 and the first insulating film 22 formed on the side walls of the first gate electrode 18 serving as masks, first extension regions 40 are formed in the surface layer of the p-type well 12a located immediately below the first insulating film 22 (FIG. 14C).

Figure 14D:
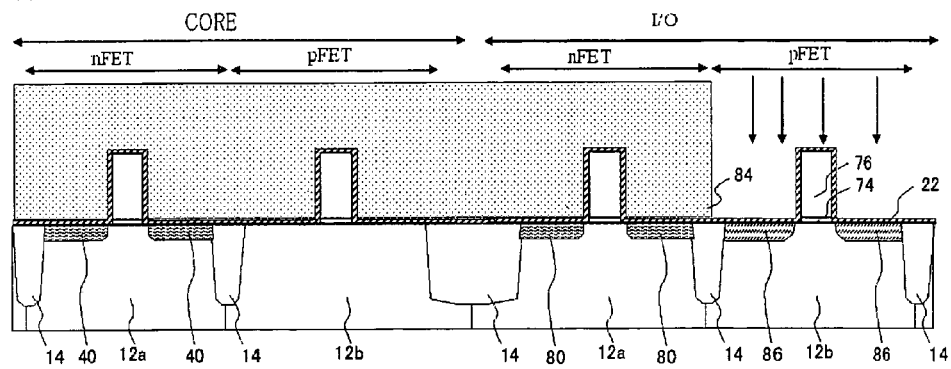

The resist film 82 is then removed. At this point, the surfaces of the first extension regions 40 are protected by the first insulating film 22. Accordingly, the first extension regions 40 are not adversely affected by the stripper or plasma or the like used for removing the resist film 82. A resist film 84 that is patterned so as to open the p-type FET forming region of the I/O forming region is then provided to cover the core forming region and the I/O forming region. The surface layer of the n-type well 12b located immediately below the first insulating film 22 is doped with p-type impurities such as B or $BF_2$, with the fourth gate electrode 76 and the first insulating film 22 formed on the side walls of the fourth gate electrode 76 serving as masks. Accordingly, fourth extension regions 86 are formed in the surface layer of the n-type well 12b (FIG. 14D).

Figure 15E:
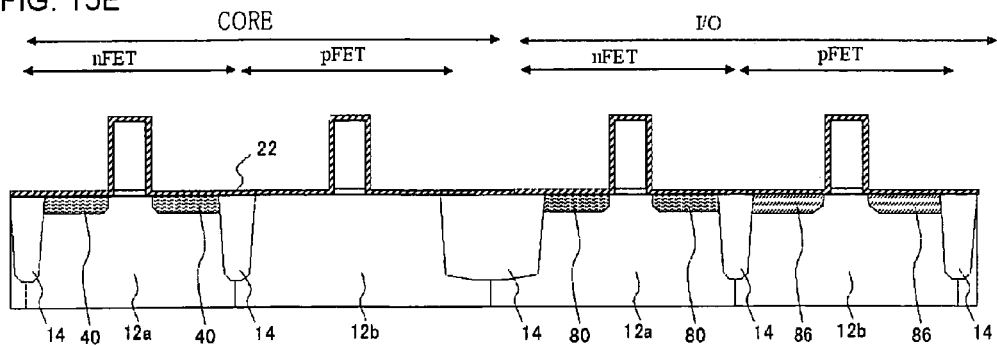
FIGS. 15E and 15F are process schematic cross-sectional views illustrating the method of manufacturing the semiconductor device in accordance with the third embodiment.

The resist film 84 is then removed (FIG. 15E). At this point, the surfaces of the first extension regions 40 are protected by the first insulating film 22. Accordingly, the first extension regions 40 are not adversely affected by the stripper or plasma or the like used for removing the resist film 84.

Figure 15F:
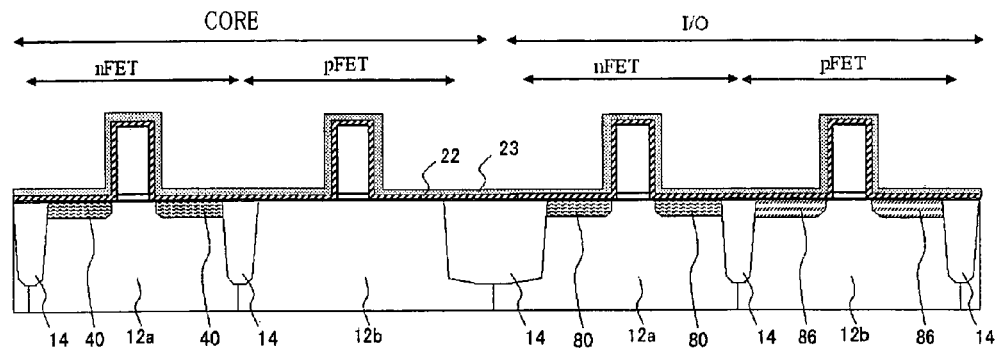

A second insulating film 23 is then formed on the surface of the first insulating film 22 in the core forming region and the I/O forming region (FIG. 15F).

Figure 16G:
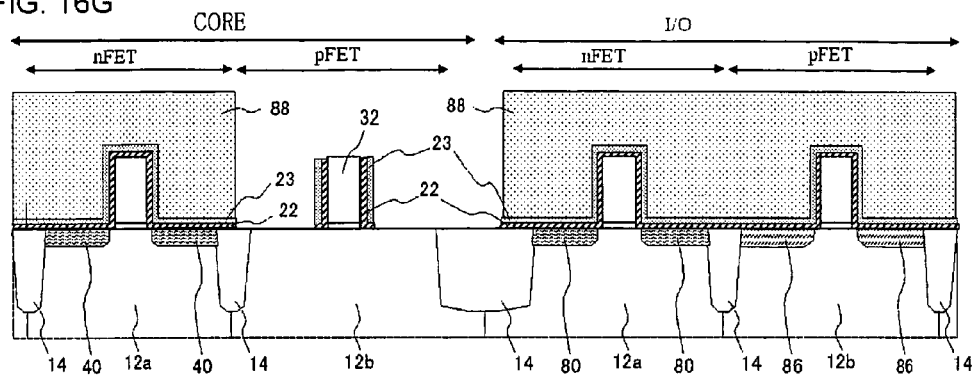
FIGS. 16G and 16H are process schematic cross-sectional views illustrating the method of manufacturing the semiconductor device in accordance with the third embodiment.

A resist film 88 that is patterned so as to open the p-type FET forming region of the core forming region is provided to cover the core forming region and the I/O forming region. In the p-type FET forming region, etching is performed, with the second gate electrode 32 and the first insulating film 22 and the second insulating film 23 formed on the side walls of the second gate electrode 32 serving se masks. Through the etching, the first insulating film 22 and the second insulating film 23 formed on the surface of the semiconductor substrate 12 are removed. In this manner, the surface of the semiconductor substrate 12 is exposed in the p-type FET forming region, and the stacked structure of the first insulating film 22 and the second insulating film 23 is left only on the side walls of the second gate oxide film 30 and the second gate electrode 32 (FIG. 16G).

Figure 16H:
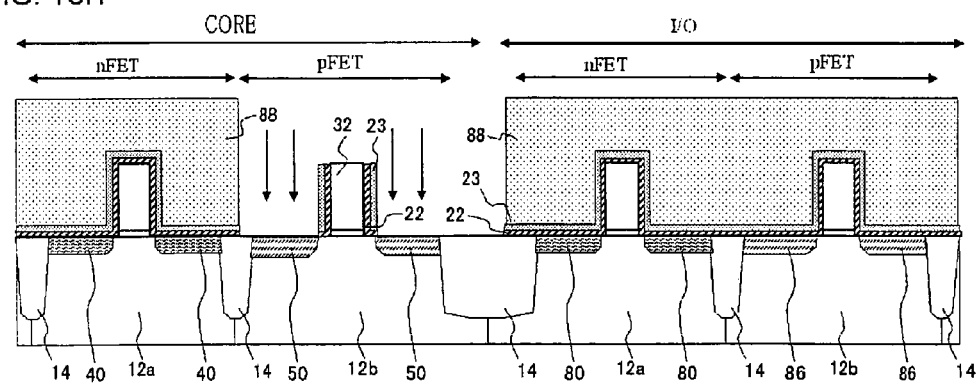

The exposed surface layer of the semiconductor substrate 12 is doped with p-type impurities such as B or $BF_2$, with the second gate electrode 32 and the first insulating film 22 and the second insulating film 23 formed on the side walls of the second gate electrode 32 serving as masks. Accordingly, second extension regions 50 are formed in the surface layer of the n-type well 12b (FIG. 16H).

Figure 17I:
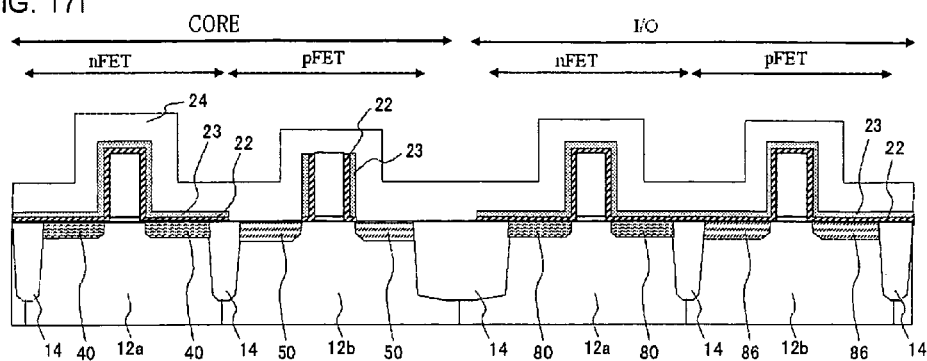
FIGS. 17I and 17J are process schematic cross-sectional views illustrating the method of manufacturing the semiconductor device in accordance with the third embodiment.
Figure 17J:
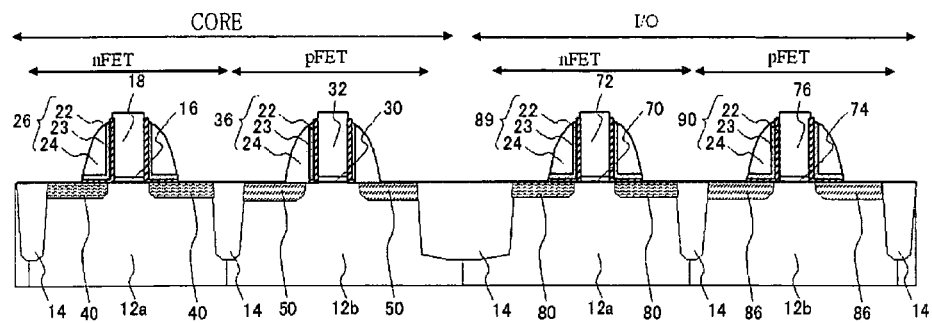

The resist film 88 is then removed. At this point, the surfaces of the first extension regions 40 are protected by the first insulating film 22 and the second insulating film 23. Accordingly, the first extension regions 40 are not adversely affected by the stripper or plasma or the like used for removing the resist film 88. A sidewall insulating film 24 is then formed to cover the core forming region and the I/O forming region (FIG. 17I). Etchback is then performed so as to form first sidewalls 26 and second sidewalls 36 in the core forming region, and third sidewalls 89 and fourth sidewalls 90 in the I/O forming region (FIG. 17J).

Each of the third sidewalls 89 is formed with the first insulating film 22, the second insulating film 23, and the sidewall insulating film 24. The first insulating film 22 of each of the third sidewalls 89 is formed along the side walls of the third gate oxide film 70 and the third gate electrode 72, and the surface of the semiconductor substrate 12. The first insulating film 22 is L-shaped in section. The second insulating film 23 of each of the third sidewalls 89 is formed on the surface of the first insulating film 22 of the third sidewall 89, and is L-shaped in section. The sidewall insulating film 24 of each of the third sidewalls 89 is formed to cover the surface of the second insulating film 23 of the third sidewall 89, and has a fan-like shape in section. The fourth sidewalls 90 have the same structures as the third sidewalls 89.

Figure 18K:
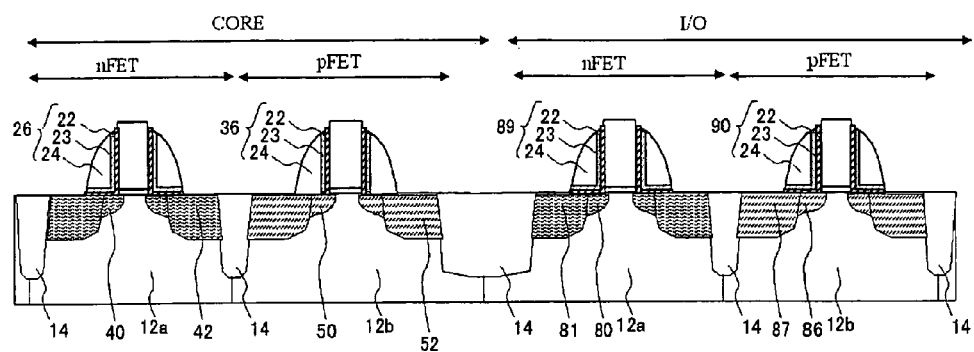
FIGS. 18K and 18L are process schematic cross-sectional views illustrating the method of manufacturing the semiconductor device in accordance with the third embodiment.

Next, using a resist film (not shown) that is patterned into a predetermined shape, the semiconductor substrate 12 is doped with n-type impurities, so as to form first source/drain regions 42 and third source/drain regions 81 in the semiconductor substrate 12. Annealing is then performed to activate the impurities in those diffusion layers. Further, using a resist film (not shown), the semiconductor substrate 12 is doped with p-type impurities, so as to form second source/drain regions 52 and fourth source/drain regions 87 in the semiconductor substrate 12. Annealing is then performed to activate the impurities in those diffusion layers (FIG. 18K).

Figure 18L:
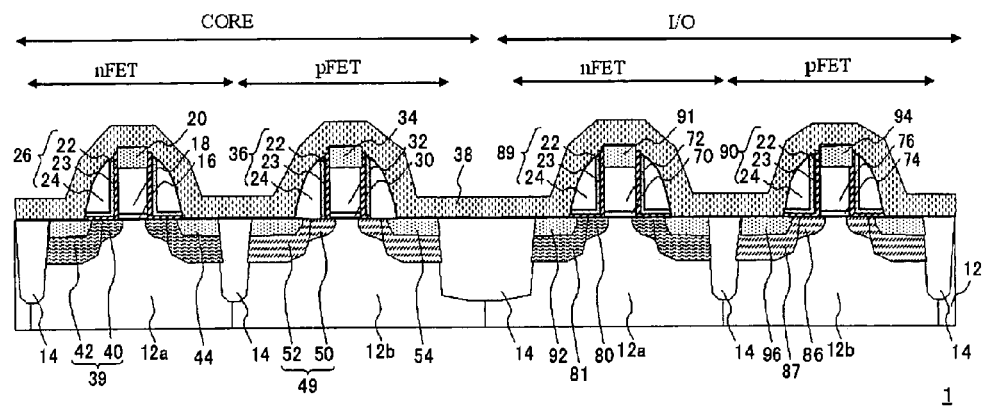

With the gate electrodes and the sidewalls serving as masks, silicide layers are formed in the semiconductor substrate 12 in the core forming region and the I/O forming region. Further, silicide layers are formed in the surface layers of the gate electrodes. More specifically, in the n-type FET forming region of the core forming region, a pair of first silicide layers 44 are formed on the semiconductor substrate 12, and a first silicide layer 20 is also formed on the surface layer of the first gate electrode 18. Likewise, in the p-type FET forming region of the core forming region, a pair of second silicide layers 54 are formed on the semiconductor substrate 12, and a second silicide layer 54 is formed on the second gate electrode 32. In the n-type FET forming region of the I/O forming region, a pair of third silicide layers 92 are formed on the semiconductor substrate 12, and a third silicide layer 91 is also formed on the surface layer of the third gate electrode 72. Likewise, in the p-type FET forming region of the I/O forming region, a pair of fourth silicide layers 96 are formed on the semiconductor substrate 12, and a fourth silicide layer 94 is formed on the surface layer of the fourth gate electrode 76. Further, a stopper layer 38 that is made of SiN or the like is formed so as to cover the core forming region and the I/O forming region, thereby completing the semiconductor device 1 (FIG. 18L). As described above, in the case where the semiconductor device 1 includes a core forming region and an I/O forming region, the gate sidewall structure in the p-type FET forming region of the core forming region can be made different from the others, while the gate sidewall structures are the same between the n-type FET forming region and the p-type FET forming region of the I/O forming region according to the third embodiment.

As shown in FIG. 13B, the first insulating film 22 is formed on the surfaces of the regions in which the first extension regions 40 are to be formed. Accordingly, during the procedures illustrated in FIGS. 13B and 14C, the surfaces of the regions in which the first extension regions 40 are to be formed are not adversely affected by the stripper or plasma or the like used for removing the resist film 78.

Also, as shown in FIG. 14C, the first insulating film 22 is formed on the surfaces of the first extension regions 40. Accordingly, during the procedures illustrated in FIGS. 14C and 14D, the first extension regions 40 are not adversely affected by the stripper or plasma or the like used for removing the resist film 82. Further, during the procedures illustrated in FIGS. 14D and 15E, the first extension regions 40 are not adversely affected by the stripper or plasma or the like used for removing the resist film 84.

Also, as shown in FIG. 16H, the first insulating film 22 and the second insulating film 23 are formed on the surfaces of the first extension regions 40. Accordingly, during the procedures illustrated in FIGS. 16H and 17I, the first extension regions 40 are not adversely affected by the stripper or plasma or the like used for removing the resist film 88.

By the manufacturing method in accordance with this embodiment, deterioration can be prevented since the substrate surface formed with the first extension regions 40 are protected by insulating films. By this method, degradation of the characteristics of the n-type FET can be restrained. Accordingly, a short-channel effect in the n-type FET forming region can be restricted, and the characteristics of the n-type FET can be improved. Thus, a semiconductor device that has very narrow variations in n-type FET characteristics can be provided by the above-described manufacturing method. Furthermore, since etchback is not required to be performed on the substrate protection film prior to the step of doping impurities to the p-type FET in the I/O forming region in this embodiment, the number of manufacturing steps can be made less than that in the manufacturing method by which a substrate protection film is provided in the p-type FET in the I/O forming region. Also, the manufacturing time can be shortened, and the initial cost can be lowered.

Although the present invention has been described by way of the embodiments with reference to the accompanying drawings, those embodiments are merely examples, and other various structures may be employed.

For example, insulating films may be stacked so that the substrate protection film includes three or more layers.

In the semiconductor device 1 of the third embodiment, each of the first sidewalls 26 may be formed only with a first insulating film 21 and a sidewall insulating film 24.

In the third embodiment, the example in which the third extension regions 80, the first extension regions 40, and the fourth extension regions 86 are formed in this order (FIGS. 13B through 14D) is described. However, the order is not limited to that, and those regions may be formed in arbitrary order.

Also, in this embodiment, the n-type FET forming region and the p-type FET forming region are adjacent to each other. However, those regions may be located at a predetermined distance from each other.

EXAMPLES

In the following, specific examples of the present invention will be described, but the present invention is not limited to those examples.

Example 1

In Example 1, the semiconductor device 1 was manufactured by the manufacturing method of the first embodiment (FIGS. 4A through 8K) under the following conditions.

Figure 19:
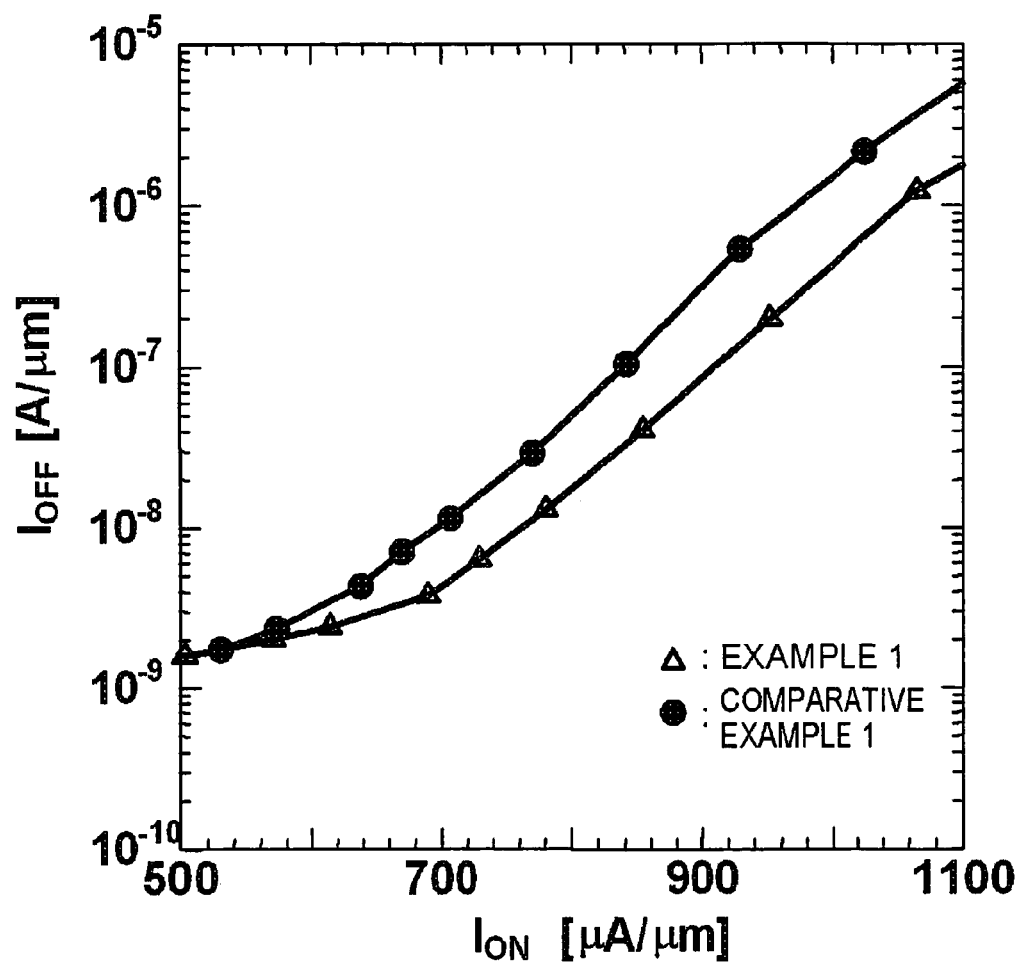
FIG. 19 is a graph showing the results of measurement of the ON current and OFF current of n-type FETs of semiconductor devices.

The first insulating film 22, the second insulating film 23, and the sidewall insulating film 24 that constitute the first sidewalls 26 and the second sidewalls 36 were formed under the following conditions:

The conditions for forming the first insulating film 22
Thermal oxidization method: $SiO_2$ film, 100 angstroms in film thickness;
The conditions for forming the second insulating film 23
CVD method: SiN film, 100 angstroms in film thickness;
The conditions for forming the sidewall insulating film 24
CVD method: $SiO_2$ film, 100 angstroms in film thickness;

The characteristics of the n-type FET of the semiconductor device 1 in Example 1 were measured. The results are shown in FIG. 19. The graph in FIG. 19 is plotted by measuring $I_{ON}$ and $I_{OFF}$ of n-type FETs with various gate lengths. Here, $I_{ON}$ represents the current value per unit gate width when the n-type FET is in an ON state, and $I_{OFF}$ represents the current value per unit gate width when the n-type FET is in an OFF state.

COMPARATIVE EXAMPLE 1

In Comparative Example 1, a semiconductor device 100 was manufactured by the conventional manufacturing method (FIGS. 21A through 23G) under the following conditions.

The first insulating film 122, the second insulating film 123, and the sidewall insulating film 124 that constitute the first sidewalls 126 and the second sidewalls 136 were formed under the following conditions:

The conditions for forming the first insulating film 122
Thermal oxidization method: $SiO_2$ film, 100 angstroms in film thickness;
The conditions for forming the second insulating film 123
CVD method: SiN film, 100 angstroms in film thickness;
The conditions for forming the sidewall insulating film 124
CVD method: $SiO_2$ film, 100 angstroms in film thickness;

The characteristics of the n-type FET of the semiconductor device 100 in Comparative Example 1 were measured. The results are shown in FIG. 19.

Figure 20:
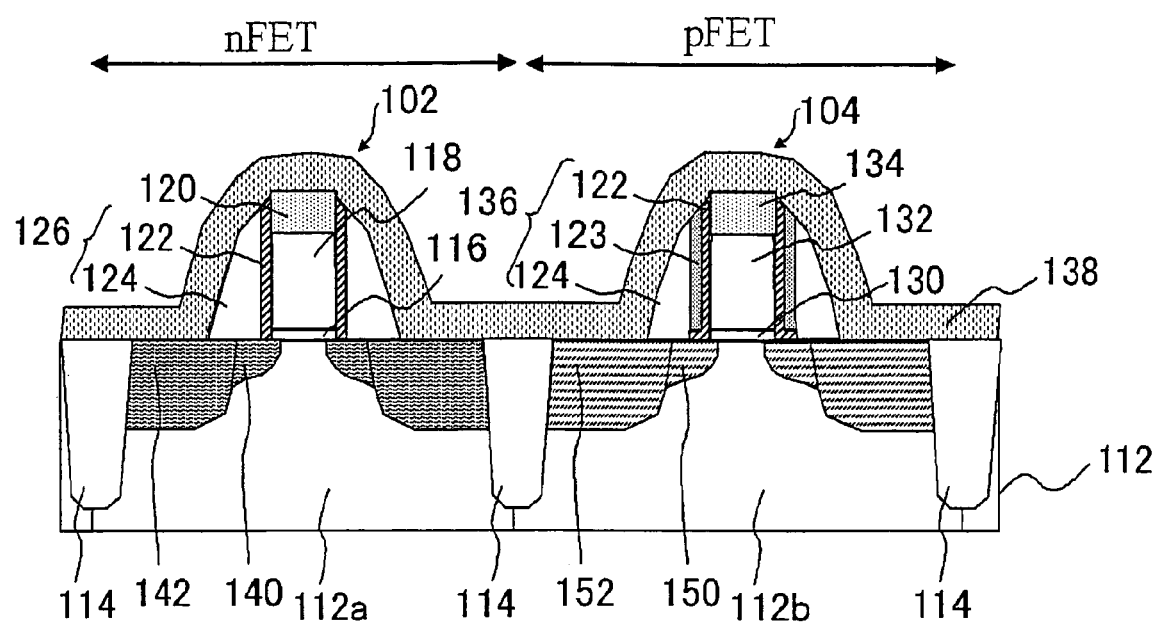
FIG. 20 is a schematic cross-sectional view of a conventional semiconductor device.
Figure 21A:
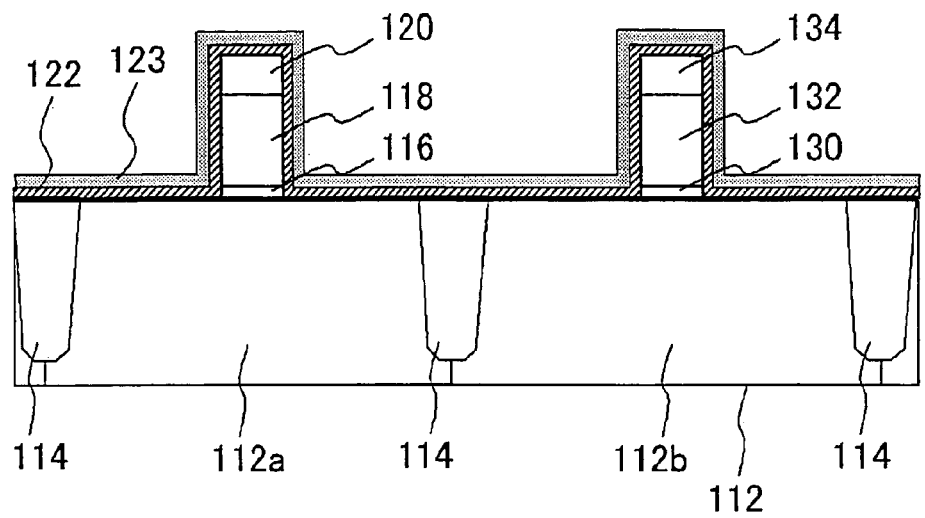
FIGS. 21A and 21B are process schematic cross-sectional views illustrating a method of manufacturing the conventional semiconductor device.
Figure 21B:
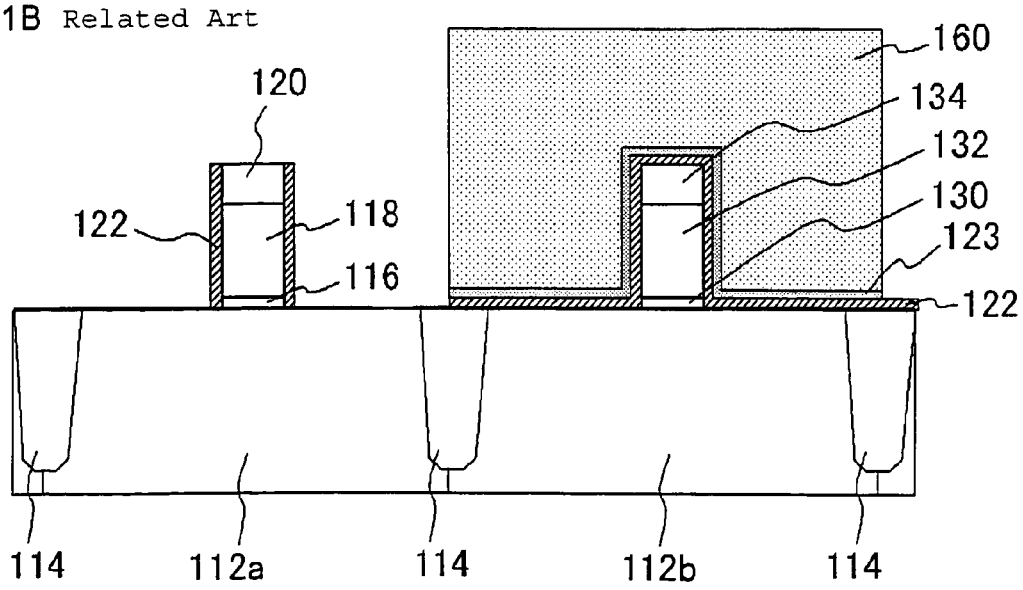
Figure 23E:
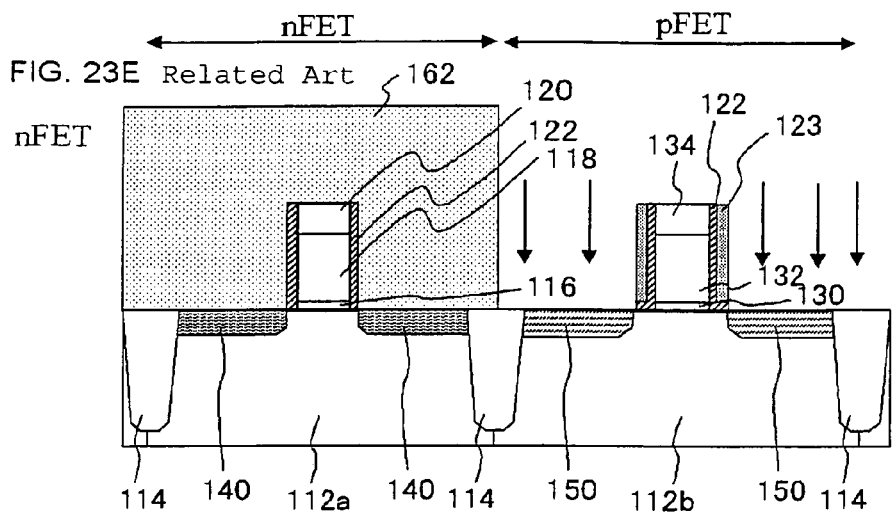
FIGS. 23E and 23G are process schematic cross-sectional views illustrating the method of manufacturing the conventional semiconductor device.
Figure 23F:
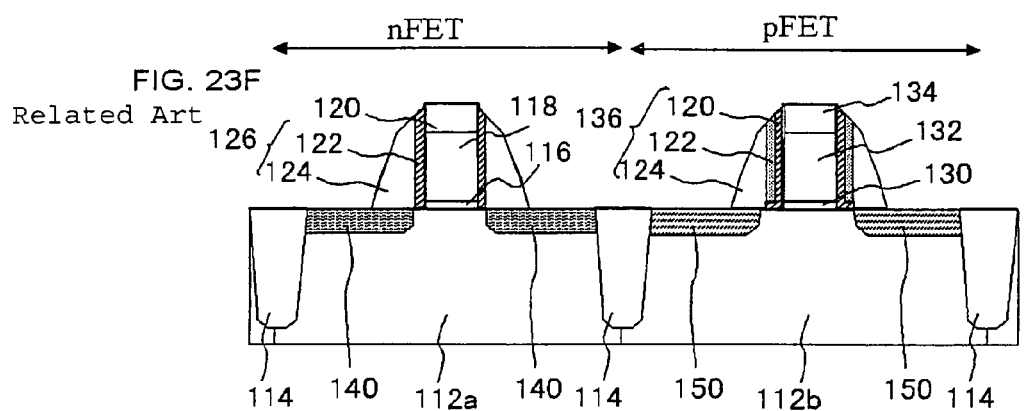
Figure 23G:
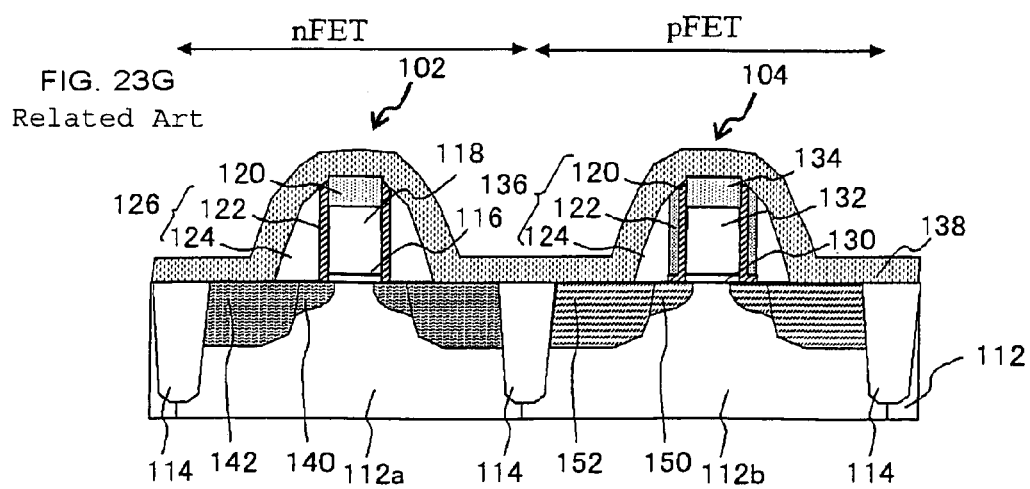

As shown in FIG. 1, the semiconductor device 1 manufactured by the method of the Example 1 has the substrate protection films each including the first insulating film 22a and the second insulating film 23a at both sides of the first gate electrode 18 on the surface of the semiconductor substrate 12 in the n-type FET forming region. On the other hand, the semiconductor device 100 of Comparative Example 1 has the sidewall insulating film 124 being in contact with the surface of the semiconductor substrate 112 at both sides of the first gate electrode 118, as shown in FIG. 20. In this structure, the substrate protection films cannot be formed on the surface of the semiconductor substrate 112.

The characteristics of the n-type FETs of those semiconductor devices were measured to confirm that the semiconductor device 1 of Example 1 had a lower ON-OFF ratio ($I_{OFF}/I_{ON}$) and an n-type FET with better characteristics than the semiconductor device 100 of Comparative Example 1. Accordingly, it was confirmed that, compared with the semiconductor device 100 of Comparative Example 1, the semiconductor device 1 of Example 1 could more effectively restrain degradation of the characteristics of the n-type FET, restrict a short-channel effect in then-type FET forming region, and improve the characteristics of the n-type FET.

It is apparent that the present invention is not limited to the above embodiment, that may be modified and changed without departing from the scope and spirit of the invention.

What is claimed is:

1. A method of manufacturing a semiconductor device, comprising:

forming a substrate protection film so as to cover an n-type FET forming region having a first gate electrode formed on a semiconductor substrate and a p-type FET forming region having a second gate electrode formed on said semiconductor substrate;

opening said p-type FET forming region by patterning a resist film after the resist film is formed so as to cover said n-type FET forming region and said p-type FET forming region;

exposing a surface of said semiconductor substrate by selectively removing said substrate protection film in said p-type FET forming region, so as to leave said substrate protection film on side walls of said second gate electrode;

forming a pair of p-type extension regions in the vicinity of a surface of said semiconductor substrate at both sides of said second gate electrode by doping impurities to said semiconductor substrate, with said resist film, said second gate electrode, and said substrate protection film formed on the side walls of said second electrode serving as masks; and removing said resist film formed on said n-type FET forming region, wherein a portion of the substrate protection film over the n-type FET forming region remains over an n-type diffusion layer away from side walls of the first gate electrode.

2. The method of manufacturing a semiconductor device according to claim 1, further comprising forming a pair of n-type extension regions in the vicinity of a surface of said semiconductor substrate at both sides of said first gate electrode, before said opening said p-type FET forming region.

3. The method of manufacturing a semiconductor device according to claim 1, wherein said forming the substrate protection film comprises:

opening said n-type FET forming region by patterning a resist film after the resist film is formed so as to cover the n-type FET forming region having the first gate electrode formed on the semiconductor substrate and the p-type FET forming region having the second gate electrode formed on said semiconductor substrate; and forming a pair of n-type extension regions in the vicinity of a surface of said semiconductor substrate at both sides of said first gate electrode by doping impurities to said semiconductor substrate, with said resist film and said first gate electrode serving as masks.

4. A method of manufacturing a semiconductor device, comprising:

forming a substrate protection film so as to cover an n-type FET forming region having a first gate electrode formed on a semiconductor substrate and a p-type FET forming region having a second gate electrode formed on said semiconductor substrate;

opening said p-type FET forming region by patterning a resist film after the resist film is formed so as to cover said n-type FET forming region and said p-type FET forming region;

exposing a surface of said semiconductor substrate by selectively removing said substrate protection film in said p-type FET forming region, so as to leave said substrate protection film on side walls of said second gate electrode;

forming a pair of p-type extension regions in the vicinity of a surface of said semiconductor substrate at both sides of said second gate electrode by doping impurities to said semiconductor substrate, with said resist film, said second gate electrode, and said substrate protection film formed on the side walls of said second electrode serving as masks; and removing said resist film formed on said n-type FET forming region, wherein said substrate protection film is formed of a first insulating film and a second insulating film; and said forming said substrate protection film comprises:

forming the first insulating film so as to cover said n-type FET forming region having said first gate electrode formed on said semiconductor substrate and said p-type FET forming region having said second gate electrode formed on said semiconductor substrate;

opening said n-type FET forming region by patterning said resist film after the resist film is formed so as to cover said n-type FET forming region and said p-type FET forming region;

forming a pair of n-type extension regions in the vicinity of a surface of said semiconductor substrate located immediately below said first insulating film in said n-type FET forming region, by doping impurities to said semiconductor substrate, with said resist film, said first gate electrode, and said first insulating film on side walls of said first gate electrode serving as masks; and forming said second insulating film so as to cover said n-type FET forming region and said p-type FET forming region.

5. A method of manufacturing a semiconductor device, comprising:

forming a substrate protection film so as to cover an n-type FET forming region having a first gate electrode formed on a semiconductor substrate and a p-type FET forming region having a second gate electrode formed on said semiconductor substrate;

opening said p-type FET forming region by patterning a resist film after the resist film is formed so as to cover said n-type FET forming region and said p-type FET forming region;

exposing a surface of said semiconductor substrate by selectively removing said substrate protection film in said p-type FET forming region, so as to leave said substrate protection film on side walls of said second gate electrode;

forming a pair of p-type extension regions in the vicinity of a surface of said semiconductor substrate at both sides of said second gate electrode by doping impurities to said semiconductor substrate, with said resist film, said second gate electrode, and said substrate protection film formed on the side walls of said second electrode serving as masks; and removing said resist film formed on said n-type FET forming region, wherein, after said removing the resist film formed on said n-type FET forming region, said method further comprises:

forming first and second sidewalls with a sidewall insulating film and said substrate protection film on the side walls of said first gate electrode and said second gate electrode by performing etchback on said sidewall insulating film formed so as to cover said n-type FET forming region and said p-type FET forming region;

opening said n-type FET forming region by patterning a resist film after the resist film is formed so as to cover said n-type FET forming region and said p-type FET forming region;

forming a pair of n-type source/drain regions in the vicinity of a surface of said semiconductor substrate at both sides of said first sidewall and, with said resist film, said first gate electrode, and said first sidewall serving as masks;

opening said p-type FET forming region by patterning a resist film after the resist film is formed so as to cover said n-type FET forming region and said p-type FET forming region; and forming a pair of p-type source/drain regions in the vicinity of a surface of said semiconductor substrate at both sides of said second sidewall by doping impurities to said semiconductor substrate, with said resist film, said second gate electrode, and said second sidewall serving as masks.

6. The method of manufacturing a semiconductor device according to claim 1, wherein said substrate protection film is formed of a first insulating film; and said forming the substrate protection film comprises:

opening said n-type FET forming region by patterning a resist film after the resist film is formed so as to cover said n-type FET forming region and said p-type PET forming region;

forming a pair of n-type extension regions in the vicinity of a surface of said semiconductor substrate in said n-type FET forming region, with said resist film, said first gate electrode serving as masks; and forming said first insulating film so as to cover said n-type PET forming region and said p-type PET forming region.

7. A method of manufacturing a semiconductor device, comprising:

forming a substrate protection film so as to cover an n-type PET forming region having a first gate electrode formed on a semiconductor substrate and a p-type PET forming region having a second gate electrode formed on said semiconductor substrate;

opening said p-type PET forming region by patterning a resist film after the resist film is formed so as to cover said n-type FET forming region and said p-type FET forming region;

exposing a surface of said semiconductor substrate by selectively removing said substrate protection film in said p-type FET forming region, so as to leave said substrate protection film on side walls of said second gate electrode;

forming a pair of p-type extension regions in the vicinity of a surface of said semiconductor substrate at both sides of said second gate electrode by doping impurities to said semiconductor substrate, with said resist film, said second gate electrode, and said substrate protection film formed on the side walls of said second electrode serving as masks; and removing said resist film formed on said n-type FET forming region, wherein said n-type FET forming region having said first gate electrode and said p-type FET forming region having said second gate electrode are formed in a core forming region;

said method of manufacturing a semiconductor device further comprises:

forming a substrate protection film so as to cover said n-type FET forming region and said p-type FET forming region in said core forming region, an n-type FET forming region having a third gate electrode formed on said semiconductor substrate in an I/O forming region, and a p-type FET forming region having a fourth gate electrode formed on said semiconductor substrate in said I/O forming region;

opening said p-type FET forming region in said core forming region by patterning a resist film after the resist film is formed so as to cover said n-type FET forming region in said core forming region, said p-type FET forming region in said core forming region, said n-type FET forming region in said I/O forming region, and said p-type FET forming region in said I/O forming region;

exposing a surface of said semiconductor substrate by selectively removing said substrate protection film in said p-type FET forming region in said core forming region so as to leave said substrate protection film only on side walls of said second gate electrode;

forming a pair of p-type extension regions at both sides of said second gate electrode in the vicinity of a surface of said semiconductor substrate by doping impurities to said semiconductor substrate, with said resist film, said second gate electrode, and said substrate protection film formed on the side walls of said second gate electrode serving as masks; and removing said resist film formed in said n-type FET forming region in said core forming region, in said n-type FET forming region in said I/O forming region, and in said p-type FET forming region in said I/O forming region.

* * * * *